(12) United States Patent
Moro et al.

(10) Patent No.: US 7,648,925 B2
(45) Date of Patent: Jan. 19, 2010

(54) MULTILAYER BARRIER STACKS AND METHODS OF MAKING MULTILAYER BARRIER STACKS

(75) Inventors: Lorenza Moro, San Carlos, CA (US); Xi Chu, Freemont, CA (US)

(73) Assignee: Vitex Systems, Inc., San Jose, CA (US)

( * ) Notice: Subject to any disclaimer, the term of this patent is extended or adjusted under 35 U.S.C. 154(b) by 8 days.

(21) Appl. No.: 11/776,616

(22) Filed: Jul. 12, 2007

(65) Prior Publication Data

US 2007/0281174 A1     Dec. 6, 2007

Related U.S. Application Data

(63) Continuation-in-part of application No. 11/439,474, filed on May 23, 2006, which is a continuation-in-part of application No. 11/112,880, filed on Apr. 22, 2005, which is a continuation-in-part of application No. 10/412,133, filed on Apr. 11, 2003.

(51) Int. Cl.
*H01L 21/31*     (2006.01)
*H01L 21/469*    (2006.01)

(52) U.S. Cl. .................. 438/780; 438/680; 438/513; 257/E21.17; 257/E21.007; 257/E21.218; 257/E21.267; 257/E21.329

(58) Field of Classification Search .............. 438/30, 438/57, 513, 680, 679, 769, 780, 782
See application file for complete search history.

(56) References Cited

U.S. PATENT DOCUMENTS 2,382,432 A    8/1945   McManus et al.
2,384,500 A    9/1945   Stoll
3,475,307 A    10/1969  Knox et al.

(Continued)

FOREIGN PATENT DOCUMENTS

BE    704297    2/1968

(Continued)

OTHER PUBLICATIONS

Wong, F.L., et al., "Long-lifetime thin-film encapsulated organic light-emitting diodes," Journal of Applied Physics 104, pp. 014509-1-4 (2008).

(Continued)

*Primary Examiner*—David Nhu
(74) *Attorney, Agent, or Firm*—Dinsmore & Shohl LLP

(57) ABSTRACT

An improved barrier stack. The barrier stack is made by the process of depositing the polymeric decoupling layer on a substrate; depositing a first inorganic layer on the decoupling layer under a first set of conditions wherein an ion and neutral energy arriving at the substrate is less than about 20 eV so that the first inorganic layer is not a barrier layer, wherein a temperature of the substrate is less than about 150° C.; and depositing a second inorganic layer on the first inorganic layer under a second set of conditions wherein an ion and neutral energy arriving at the substrate is greater than about 50 eV so that the second inorganic layer is a barrier layer. Methods of reducing damage to a polymeric layer in a barrier stack are also described.

29 Claims, 27 Drawing Sheets

U.S. PATENT DOCUMENTS

| | | | |
|---|---|---|---|
| 3,607,365 A | 9/1971 | Lindlof | |
| 3,941,630 A | 3/1976 | Larrabee | |
| 4,061,835 A | 12/1977 | Poppe et al. | |
| 4,098,965 A | 7/1978 | Kinsman | |
| 4,266,223 A | 5/1981 | Frame | |
| 4,283,482 A | 8/1981 | Hattori et al. | |
| 4,313,254 A | 2/1982 | Feldman et al. | |
| 4,426,275 A | 1/1984 | Meckel et al. | |
| 4,521,458 A | 6/1985 | Nelson | |
| 4,537,814 A | 8/1985 | Itoh et al. | |
| 4,555,274 A | 11/1985 | Kitajima et al. | |
| 4,557,978 A | 12/1985 | Mason | |
| 4,572,842 A | 2/1986 | Dietrich et al. | |
| 4,581,337 A | 4/1986 | Frey et al. | |
| 4,624,867 A | 11/1986 | Iijima et al. | |
| 4,695,618 A | 9/1987 | Mowrer | |
| 4,710,426 A | 12/1987 | Stephens | |
| 4,722,515 A | 2/1988 | Ham | |
| 4,768,666 A | 9/1988 | Kessler | |
| 4,842,893 A | 6/1989 | Yializis et al. | |
| 4,843,036 A | 6/1989 | Schmidt et al. | |
| 4,855,186 A | 8/1989 | Grolig et al. | |
| 4,889,609 A | 12/1989 | Cannella | |
| 4,913,090 A | 4/1990 | Harada et al. | |
| 4,931,158 A | 6/1990 | Bunshah et al. | |
| 4,934,315 A | 6/1990 | Linnebach et al. | |
| 4,954,371 A | 9/1990 | Yializis | |
| 4,977,013 A | 12/1990 | Ritchie et al. | |
| 5,032,461 A | 7/1991 | Shaw et al. | |
| 5,036,249 A | 7/1991 | Pike-Biegunski et al. | |
| 5,047,131 A | 9/1991 | Wolfe et al. | |
| 5,059,861 A | 10/1991 | Littman et al. | |
| 5,124,204 A | 6/1992 | Yamashita et al. | |
| 5,189,405 A | 2/1993 | Yamashita et al. | |
| 5,203,898 A | 4/1993 | Carpenter et al. | |
| 5,204,314 A | 4/1993 | Kirlin et al. | |
| 5,237,439 A | 8/1993 | Misono et al. | |
| 5,260,095 A | 11/1993 | Affinito | |
| 5,336,324 A | 8/1994 | Stall et al. | |
| 5,354,497 A | 10/1994 | Fukuchi et al. | |
| 5,356,947 A | 10/1994 | Ali et al. | |
| 5,357,063 A | 10/1994 | House et al. | |
| 5,376,467 A | 12/1994 | Abe et al. | |
| 5,393,607 A | 2/1995 | Kawasaki et al. | |
| 5,395,644 A | 3/1995 | Affinito | |
| 5,402,314 A | 3/1995 | Amago et al. | |
| 5,427,638 A | 6/1995 | Goetz et al. | |
| 5,440,446 A | 8/1995 | Shaw et al. | |
| 5,451,449 A | 9/1995 | Shetty et al. | |
| 5,461,545 A | 10/1995 | Leroy et al. | |
| 5,464,667 A | 11/1995 | Kohler et al. | |
| 5,510,173 A | 4/1996 | Pass et al. | |
| 5,512,320 A | 4/1996 | Turner et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,578,141 A | 11/1996 | Mori et al. | |
| 5,607,789 A | 3/1997 | Treger et al. | |
| 5,620,524 A | 4/1997 | Fan et al. | |
| 5,629,389 A | 5/1997 | Roitman et al. | |
| 5,652,192 A | 7/1997 | Matson et al. | |
| 5,654,084 A | 8/1997 | Egert | |
| 5,660,961 A | 8/1997 | Yu | |
| 5,665,280 A | 9/1997 | Tropsha | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,695,564 A | 12/1997 | Imahashi | |
| 5,711,816 A | 1/1998 | Kirlin et al. | |
| 5,725,909 A | 3/1998 | Shaw et al. | |
| 5,731,661 A | 3/1998 | So et al. | |
| 5,736,207 A | 4/1998 | Walther et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,771,177 A | 6/1998 | Tada et al. | |
| 5,771,562 A | 6/1998 | Harvey, III et al. | |
| 5,782,355 A | 7/1998 | Katagiri et al. | |
| 5,792,550 A | 8/1998 | Phillips et al. | |
| 5,795,399 A | 8/1998 | Hasegawa et al. | |
| 5,811,177 A | 9/1998 | Shi et al. | |
| 5,811,183 A | 9/1998 | Shaw et al. | |
| 5,821,138 A | 10/1998 | Yamazaki et al. | |
| 5,821,692 A | 10/1998 | Rogers et al. | |
| 5,844,363 A | 12/1998 | Gu et al. | |
| 5,869,791 A | 2/1999 | Young | |
| 5,872,355 A | 2/1999 | Hueschen | |
| 5,891,554 A | 4/1999 | Hosokawa et al. | |
| 5,895,228 A | 4/1999 | Biebuyck et al. | |
| 5,902,641 A | 5/1999 | Affinito et al. | |
| 5,902,688 A | 5/1999 | Antoniadis et al. | |
| 5,904,958 A | 5/1999 | Dick et al. | |
| 5,912,069 A | 6/1999 | Yializis et al. | |
| 5,919,328 A | 7/1999 | Tropsha et al. | |
| 5,920,080 A | 7/1999 | Jones | |
| 5,922,161 A | 7/1999 | Wu et al. | |
| 5,929,562 A | 7/1999 | Pichler | |
| 5,934,856 A | 8/1999 | Asakawa et al. | |
| 5,945,174 A | 8/1999 | Shaw et al. | |
| 5,948,552 A | 9/1999 | Antoniadis et al. | |
| 5,952,778 A | 9/1999 | Haskal et al. | |
| 5,955,161 A | 9/1999 | Tropsha | |
| 5,965,907 A | 10/1999 | Huang et al. | |
| 5,968,620 A | 10/1999 | Harvey et al. | |
| 5,994,174 A | 11/1999 | Carey et al. | |
| 5,996,498 A | 12/1999 | Lewis | |
| 6,013,337 A | 1/2000 | Knors | |
| 6,040,017 A | 3/2000 | Mikhael et al. | |
| 6,045,864 A | 4/2000 | Lyons et al. | |
| 6,066,826 A | 5/2000 | Yializis | |
| 6,083,313 A | 7/2000 | Venkatraman et al. | |
| 6,083,628 A * | 7/2000 | Yializis | 428/463 |
| 6,084,702 A | 7/2000 | Byker et al. | |
| 6,087,007 A | 7/2000 | Fuji et al. | |
| 6,092,269 A | 7/2000 | Yializis et al. | |
| 6,106,627 A | 8/2000 | Yializis et al. | |
| 6,117,266 A | 9/2000 | Horzel et al. | |
| 6,118,218 A | 9/2000 | Yializis et al. | |
| 6,137,221 A | 10/2000 | Roitman et al. | |
| 6,146,225 A | 11/2000 | Sheates et al. | |
| 6,146,462 A | 11/2000 | Yializis et al. | |
| 6,150,187 A | 11/2000 | Zyung et al. | |
| 6,165,566 A | 12/2000 | Tropsha | |
| 6,178,082 B1 | 1/2001 | Farooq et al. | |
| 6,195,142 B1 | 2/2001 | Gyotoku et al. | |
| 6,198,217 B1 | 3/2001 | Suzuki et al. | |
| 6,198,220 B1 | 3/2001 | Jones et al. | |
| 6,203,898 B1 | 3/2001 | Kohler et al. | |
| 6,207,238 B1 | 3/2001 | Affinito | |
| 6,207,239 B1 | 3/2001 | Affinito | |
| 6,214,422 B1 | 4/2001 | Yializis | |
| 6,217,947 B1 | 4/2001 | Affinito | |
| 6,224,948 B1 | 5/2001 | Affinito | |
| 6,228,434 B1 | 5/2001 | Affinito | |
| 6,228,436 B1 | 5/2001 | Affinito | |
| 6,231,939 B1 | 5/2001 | Shaw et al. | |
| 6,264,747 B1 | 7/2001 | Shaw et al. | |
| 6,268,695 B1 | 7/2001 | Affinito | |
| 6,274,204 B1 | 8/2001 | Affinito | |
| 6,322,860 B1 | 11/2001 | Stein et al. | |
| 6,333,065 B1 | 12/2001 | Arai et al. | |

| Patent | Date | Inventor |
|---|---|---|
| 6,348,237 B2 | 2/2002 | Kohler et al. |
| 6,350,034 B1 | 2/2002 | Fleming et al. |
| 6,352,777 B1 | 3/2002 | Bulovic et al. |
| 6,358,570 B1 | 3/2002 | Affinito |
| 6,361,885 B1 | 3/2002 | Chou |
| 6,387,732 B1 | 5/2002 | Akram |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,460,369 B2 | 10/2002 | Hosokawa |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |
| 6,548,912 B1 * | 4/2003 | Graff et al. ............. 257/787 |
| 6,569,515 B2 | 5/2003 | Hebrink et al. |
| 6,570,325 B2 | 5/2003 | Graff et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,660,409 B1 | 12/2003 | Komatsu et al. |
| 6,664,137 B2 | 12/2003 | Weaver |
| 6,681,716 B2 | 1/2004 | Schaepkens |
| 6,720,203 B2 | 4/2004 | Carcia et al. |
| 6,734,625 B2 | 5/2004 | Vong et al. |
| 6,737,753 B2 * | 5/2004 | Kumar et al. ............. 257/787 |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,835,950 B2 | 12/2004 | Brown et al. |
| 6,836,070 B2 | 12/2004 | Chung et al. |
| 6,837,950 B1 | 1/2005 | Berard |
| 6,864,629 B2 | 3/2005 | Miyaguchi et al. |
| 6,866,901 B2 * | 3/2005 | Burrows et al. ............. 428/1.5 |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,905,769 B2 | 6/2005 | Komada |
| 6,923,702 B2 | 8/2005 | Graff et al. |
| 6,936,131 B2 | 8/2005 | McCormick et al. |
| 6,975,067 B2 | 12/2005 | McCormick et al. |
| 6,994,933 B1 | 2/2006 | Bates |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,033,850 B2 | 4/2006 | Tyan et al. |
| 7,056,584 B2 | 6/2006 | Iacovangelo |
| 7,086,918 B2 | 8/2006 | Hsiao et al. |
| 7,112,351 B2 | 9/2006 | Affinito |
| 7,122,418 B2 | 10/2006 | Su et al. |
| 7,156,942 B2 | 1/2007 | McCormick et al. |
| 7,166,007 B2 | 1/2007 | Auch et al. |
| 7,183,197 B2 | 2/2007 | Won et al. |
| 7,186,465 B2 | 3/2007 | Bright |
| 7,198,832 B2 | 4/2007 | Burrows et al. |
| 7,221,093 B2 | 5/2007 | Auch et al. |
| 7,255,823 B1 | 8/2007 | Guenther et al. |
| 2001/0015074 A1 | 8/2001 | Hosokawa |
| 2001/0015620 A1 | 8/2001 | Affinito |
| 2001/0044035 A1 | 11/2001 | Morii |
| 2002/0015818 A1 | 2/2002 | Takahashi et al. |
| 2002/0022156 A1 | 2/2002 | Bright |
| 2002/0025444 A1 | 2/2002 | Hebgrink et al. |
| 2002/0068143 A1 | 6/2002 | Silvernail |
| 2002/0069826 A1 | 6/2002 | Hunt et al. |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1 | 10/2002 | Weaver |
| 2003/0038590 A1 | 2/2003 | Silvernail et al. |
| 2003/0045021 A1 | 3/2003 | Akai |
| 2003/0085652 A1 | 5/2003 | Weaver |
| 2003/0098647 A1 | 5/2003 | Silvernail et al. |
| 2003/0117068 A1 | 6/2003 | Forrest et al. |
| 2003/0124392 A1 | 7/2003 | Bright |
| 2003/0127973 A1 | 7/2003 | Weaver et al. |
| 2003/0134487 A1 | 7/2003 | Breen et al. |
| 2003/0184222 A1 | 10/2003 | Nilsson et al. |
| 2003/0197197 A1 | 10/2003 | Brown et al. |
| 2003/0218422 A1 | 11/2003 | Park et al. |
| 2003/0235648 A1 | 12/2003 | Affinito et al. |
| 2004/0018305 A1 | 1/2004 | Pagano et al. |
| 2004/0029334 A1 | 2/2004 | Bijker et al. |
| 2004/0046497 A1 | 3/2004 | Schaepkens et al. |
| 2004/0071971 A1 | 4/2004 | Locovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0209090 A1 | 10/2004 | Iwanaga |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095736 A1 | 5/2005 | Padiyath et al. |
| 2005/0099542 A1 | 5/2005 | Inai |
| 2005/0112378 A1 | 5/2005 | Naruse et al. |
| 2005/0115603 A1 | 6/2005 | Yoshida et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0174045 A1 | 8/2005 | Lee et al. |

| | | | | | | |
|---|---|---|---|---|---|---|
| 2005/0176181 | A1 | 8/2005 | Burrows et al. | JP | 08179292 | 7/1996 |
| 2005/0202646 | A1 | 9/2005 | Burrows et al. | JP | 08325713 | 10/1996 |
| 2005/0212419 | A1 | 9/2005 | Vazan et al. | JP | 8-318590 | 12/1996 |
| 2005/0224935 | A1 | 10/2005 | Schaepkens et al. | JP | 09059763 | 4/1997 |
| 2005/0238846 | A1 | 10/2005 | Arakatsu et al. | JP | 09132774 | 5/1997 |
| 2005/0239294 | A1 | 10/2005 | Rosenblum et al. | JP | 9-161967 | 6/1997 |
| 2006/0001040 | A1 | 1/2006 | Kim et al. | JP | 09161967 | 6/1997 |
| 2006/0003474 | A1 | 1/2006 | Tyan et al. | JP | 9-201897 | 8/1997 |
| 2006/0028128 | A1 | 2/2006 | Ohkubo | JP | 09232553 | 9/1997 |
| 2006/0061272 | A1 | 3/2006 | McCormick et al. | JP | 10-725 | 1/1998 |
| 2006/0062937 | A1 | 3/2006 | Padiyath et al. | JP | 10-013083 | 1/1998 |
| 2006/0063015 | A1 | 3/2006 | McCormick et al. | JP | 10-016150 | 1/1998 |
| 2006/0132461 | A1 | 6/2006 | Furukawa et al. | JP | 10312883 | 11/1998 |
| 2006/0246811 | A1 | 11/2006 | Winters et al. | JP | 10-334744 | 12/1998 |
| 2006/0250084 | A1 | 11/2006 | Cok et al. | JP | 11017106 | 1/1999 |
| 2006/0291034 | A1 | 12/2006 | Patry et al. | JP | 11040344 | 2/1999 |
| 2007/0009674 | A1 | 1/2007 | Okubo et al. | JP | 11-149826 | 6/1999 |
| 2007/0281089 | A1 | 12/2007 | Heller et al. | JP | 11255923 | 9/1999 |
| | | | | JP | 2000058258 | 2/2000 |
| | | FOREIGN PATENT DOCUMENTS | | JP | 2002/505 969 | 2/2002 |
| | | | | JP | 2002/505969 | 2/2002 |
| BG | | 704 297 | 2/1968 | JP | 2003282239 | 10/2003 |
| CA | | 2 353 506 | 5/2000 | JP | 2006-294780 | 10/2006 |
| DE | | 196 03 746 A1 | 4/1997 | WO | WO 87/07848 | 12/1987 |
| DE | | 696 15 510 T2 | 6/1997 | WO | WO 89/00337 | 1/1989 |
| EP | | 0 147 696 B1 | 7/1985 | WO | WO 95/10117 | 4/1995 |
| EP | | 0 299 753 A2 | 1/1989 | WO | WO 96/23217 | 8/1996 |
| EP | | 0 340 935 A2 | 11/1989 | WO | WO 97/04885 | 2/1997 |
| EP | | 0 390 540 B1 | 10/1990 | WO | WO 97/16053 | 5/1997 |
| EP | | 0 468 440 A2 | 1/1992 | WO | WO 97/22631 | 6/1997 |
| EP | | 0 547 550 A1 | 6/1993 | WO | WO 98/10116 | 3/1998 |
| EP | | 0 590 467 A1 | 4/1994 | WO | WO 98/18852 | 5/1998 |
| EP | | 0 722 787 A2 | 7/1996 | WO | WO 99/16557 | 4/1999 |
| EP | | 0 777 280 A2 | 6/1997 | WO | WO 99/16931 | 4/1999 |
| EP | | 0 777 281 A2 | 6/1997 | WO | WO 99/46120 | 9/1999 |
| EP | | 0 787 824 A2 | 6/1997 | WO | WO 00/26973 | 5/2000 |
| EP | | 0 787 826 A1 | 6/1997 | WO | WO 00/35603 | 6/2000 |
| EP | | 0 915 105 A1 | 5/1998 | WO | WO 00/35604 | 6/2000 |
| EP | | 0 916 394 A2 | 5/1998 | WO | WO 00/35993 | 6/2000 |
| EP | | 0 931 850 A1 | 7/1999 | WO | WO 00/36661 | 6/2000 |
| EP | | 0 977 469 A2 | 2/2000 | WO | WO 00/36665 | 6/2000 |
| EP | | 1 021 070 A1 | 7/2000 | WO | 0053423 A1 | 9/2000 |
| EP | | 1 127 381 | 8/2001 | WO | 0157904 A1 | 8/2001 |
| EP | | 1 130 420 A2 | 9/2001 | WO | WO 01/68360 | 9/2001 |
| EP | | 1 278 244 A2 | 1/2003 | WO | WO 01/81649 A1 | 11/2001 |
| EP | | 1 426 813 A2 | 6/2004 | WO | WO 01/82336 A2 | 11/2001 |
| EP | | 1514317 A1 | 3/2005 | WO | WO 01/82389 A1 | 11/2001 |
| GB | | 2 210 826 A | 6/1989 | WO | WO 01/87825 A1 | 11/2001 |
| JP | | S63-96895 | 4/1988 | WO | WO 01/89006 A1 | 11/2001 |
| JP | | 63136316 | 8/1988 | WO | WO 02/26973 A1 | 4/2002 |
| JP | | 6418441 | 1/1989 | WO | WO 03/016589 A1 | 2/2003 |
| JP | | 1041067 | 2/1989 | WO | WO 03/098716 A1 | 11/2003 |
| JP | | 01041067 | 2/1989 | WO | WO 03/098716 A1 | 11/2003 |
| JP | | S64-41192 | 2/1989 | WO | WO 2004/006199 A3 | 1/2004 |
| JP | | 02183230 | 7/1990 | WO | WO 2004/016992 A1 | 2/2004 |
| JP | | 3-183759 | 8/1991 | WO | WO 2004/070840 A1 | 8/2004 |
| JP | | 03290375 | 12/1991 | WO | WO 2004/089620 A2 | 10/2004 |
| JP | | 4-14440 | 1/1992 | WO | 2004/112165 A1 | 12/2004 |
| JP | | 4-48515 | 2/1992 | WO | WO 2005/015655 A1 | 2/2005 |
| JP | | 04267097 | 9/1992 | WO | WO 2005/045947 A2 | 5/2005 |
| JP | | 06158305 | 11/1992 | WO | WO 2005/048368 A1 | 5/2005 |
| JP | | 05-217158 | 1/1993 | WO | 2005050754 A1 | 6/2005 |
| JP | | 5-147678 | 6/1993 | WO | WO 2006/036492 A1 | 4/2006 |
| JP | | 05182759 | 7/1993 | WO | 2008140313 A1 | 11/2008 |
| JP | | 06-136159 | 5/1994 | WO | 2008142645 A1 | 11/2008 |
| JP | | 61-79644 | 6/1994 | | | |
| JP | | 06234186 A | 8/1994 | | | |
| JP | | 07074378 | 3/1995 | | OTHER PUBLICATIONS | |
| JP | | 7147189 | 6/1995 | | | |
| JP | | 07147189 | 6/1995 | Kim, Han-Ki et al., "Magnetic Field Shape Effect on Electrical Properties of TOLEDs in the Deposition of ITO Top Cathode Layer", Electrochemical and Solid-State Letters, 8(12), (2005), pp. H103-H105. | | |
| JP | | 07192866 | 7/1995 | | | |
| JP | | 8-72188 | 3/1996 | | | |
| JP | | 08171988 | 7/1996 | | | |

Moro, L. et al., "Process and design of a multilayer thin film encapsulation of passive matrix OLED displays", Organic Light-Emitting Materials and Devices VII, Proceedings of SPIE vol. 5214, 2004, pp. 83-93.

Affinito, J.D. et al.; Vacuum Deposited Polymer/metal Multilayer Films for Optical Applications; Paper No. C1.13; pp. 1-14.

Shi, M.K. et al.; Plasma treatment of PET and acrylic coating surfaces-I. In situ XPS measurements; Journal of Adhesion Science and Technology; Mar. 2000 14(12); pp. 1-8.

Affinito, J.D. et al.; Vacuum Deposition of Polymer Electrolytes on Flexible Substrates, The Ninth International Conference on Vacuum Web Coating; pp. 20-37.

Affinito, J.D. et al; Ultrahigh Rate, Wide Area, Plaza Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.

Shi, M.K. et al.; In situ and real-time monitoring of plasma-induced etching PET and acrylic films; Dec. 1999, 494; pp. 1-25.

Affinito, J.D. et al.; Vacuum Deposited Conductive Polymer Films; The Eleventh International Conference on Vacuum Web Coating; pp. 0-12.

Affinito, J.D. et al; Molecularly Doped Polymer Composite Films for Light Emitting Polymer Application Fabricated by the PML Process; 41st Technical Conference of the Society of Vacuum Coaters; 1998; pp. 220-225.

Affinito, J.D. et al; Polymer/polymer, Polymer/Oxide, and Polymer/Metal Vacuum Deposited Interferences Filters; Tenth International Vacuum Web Coating Conference; pp. 0-14.

Affinito, J.D. et al.; Vacuum Deposited Polymer/Metal Multilayer Films for Optical Application; Thin Solid Films 270, 1995; pp. 43-48.

Felts, J.T.; Transparent Barrier Coatings Update: Flexible Substrates; pp. 324-331.

Graupner, W. et al; "High Resolution Color Organic Light Emitting Diode Microdisplay Febrication Method", SPIE Proceedings; Nov. 6, 2000; pp. 11-19.

Czeremuszkin, G. et al; Permeation Through Defects in Transparent Barrier Coated Plastic Films; 43rd Annual Technical Conference Proceedings; Apr. 15, 2000; pp. 408-413.

Vossen, J.L. et al.; Thin Film Processes; Academic Press, 1978, Part II, Chapter II-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.

Affinito, J.D. et al.; Ultra High Rate, Wide Area, Plasma Polymerized Films from High Molecular Weight/Low Vapor Pressure Liquid or Solid Monomer Precursors; 45th International Symposium of the American Vacuum Society; pp. 0-26.

G. Gustafason, et al.; Flexible light-emitting diodes made from soluble conducting polymers; Letters to Nature; Vo. 357; Jun. 11, 1992; pp. 477-479.

Tropsha et al.; Combinatorial Barrier Effect of the Multilayer SiOx Coatings on Polymer Substrates; 1997 Society of Vacuum Coaters, 40th Annual Technical Conferences Proceedings; pp. 64-69.

Tropsha et al.; Activated Rate Theory Treatment of Oxygen and Water Transport through Silicon Oxide/Poly (ethylene terphthalate) Composite Barrier Structures; J. Phys. Chem B1997 pp. 2259-2266.

F.M. Penning; Electrical Discharges in Gases; 1965; pp. 1-51; Gordon and Breach, Science Publishers, New York-London-Paris.

Affinito, J.D., et al; High Rate Vacuum Deposition of Polymer Electrolytes; Journal Vacuum Science Technology A 14(3), May/Jun. 1996.

Mahon, J.K., et al; Requirements of Flexible Substrates for Organic Light Emitting Devices in Flat Panel Display Applications, Society of Vacuum Coaters, 42nd Annual Technical Conference Proceedings, 1999, pp. 456-459.

Henry, B.M. et al.; Microstructural and Gas Barrier Properties of Transparent Aluminium Oxide and Indium Tin Oxide Films; 2000; pp. 373-378; Society of Vacuum Coaters.

Phillips, R.W.; Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.

Yamada Y. et al.; The Properties of a New Transparent and Colorless Barrier Film; 1995; pp. 28-31; Society of Vacuum Coaters.

Chahroudi, D.; Transparent Glass Barrier Coatings for Flexible Film Packaging; 1991; pp. 130-133; Society of Vacuum Coaters.

Bright, Clark, I.; Transparent Barrier Coatings Based on ITO for Flexible Plastic Displays; pp. 247-255.

Henry, B.M. et al.; Microstructural Studies of Transparent Gas Barrier Coatings on Polymer Substrates; pp. 265-273.

Hibino, N. et al.; Transparent Barrier A12 03 Coating By Activated Reactive Evaporation; pp. 234-245.

Kukla, R. et al.; Transparent Barrier Coatings with EB-Evaporation, an Update; Section Five; Transparent Barrier Coating Papers; pp. 222-233.

Krug, T. et al.; New Developments in Transparent Barrier Coatings; 1993; pp. 302-305; Society Vacuum Coaters.

Affinito, J.D. et al.; PML/Oxide/PML Barrier Layer Performance Differences Arising from use of UV or Electron Beam Polymerization of the PML Layers; Thin Solid Films; Elsevier Science S.A.; vol. 308-309; Oct. 31, 1997; pp. 19-25.

Affinito, J.D. et al.; A new method for fabricating transparent barrier layers, Thin Solid Films 290-291; 1996; pp. 63-67.

Affinito, J.D. et al.; Polymer-Oxide Transparent Barrier Layers; SVC 39th Annual Technical Conference; Vacuum Web Coating Session; 1996; pp. 392-397.

Hoffman, G. et al.; Transparent Barrier Coatings by Reactive Evaporation; 1994; pp. 155-160; Society of Vacuum Coaters.

Norenberg, H. et al.; Comparative Study of Oxygen Permeation Through Polymers and Gass Barrier Films; 2000; pp. 347-351; Society of Vacuum Coaters.

Yializis, A. et al.; Ultra High Barrier Films; 2000; pp. 404-407; Society Vacuum Coaters.

Kelmberg-Sapieha, J.E. et al.; Transparent Gas Barrier Coatings Produced by Dual-Frequency PECVD; 1993; pp. 445-449; Society of Vacuum Coaters.

Finson, E. et al.; Transparent SiO2 Barrier Coatings: Conversion of Production Status; 1994; pp. 139-143; Society of Vacuum Coaters.

Yializis, A. et al.; High Oxygen Barrier Polypropylene Films Using Transparent Acrylate-A203 and Opaque Al-Acrylate Coatings; 1995; pp. 95-102; Society of Vacuum Coaters.

Shaw, D.G. et al.; Use of Vapor Deposted Acrylate Coatings to Improve the Barrier Properties of Metalized Film; 1994; pp. 240-244; Society of Vacuum Coaters.

Affinito, J.D. et al.; "Vacuum Deposited Conductive Polymer Films" The Eleventh International Conference on Vacuum Web Coating, no earlier than Feb. 1998, pp. 200-213.

Affinito, J.D. et al.; "Molecularly Doped Polymer Composite Films for Light Emitting Polymer Applications Fabricated by the PML Process" 41st Technical Conference of Society of Vacuum Coaters, Apr. 1998, pp. 1-6.

Affinito, J.D. et al.; "Vacuum Deposition of Polymer Electrolytes on Flexible Substrates" The Ninth International Conference on Vacuum Web Coating, pp. 0-16.

Bunshah, R.F. et al.; "Deposition Technologies for Films and Coatings". Noyes Publications, Park Ridge, New Jersey, 1982, p. 339.

Affinito, J.D.; Energy Res. Abstr. 18(6), #17171, 1993.

Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.

Hibino, N. et al.; Transparent Barrier $Al_2O_3$ Coating By Activated Reactive Evaporation; Thirteenth International Conference on Vacuum Web Coatings; Oct. 17-19, 1999; pp. 234-245.

Shi, M.K. et al.; Plasma treatment of PET and acrylic coating surfaces-I. In situ XPS measurements; Journal of Adhesion Science and Technology; Mar. 2000, 14(12); pp. 1-28.

Affinito, J.D. et al.; "PML/Oxide/PML Barrier Layer Performance Differences Arising From Use of UV or Electron Beam Polymerization of the PML Layers;" SVC $40^{th}$ Annual Technical Conference; Apr. 12-17, 1997; pp. 19-25.

Affinito, J.D. et al.; Ultra High Rate, Wide Area, Plasma Polymerized Films from High Molecular Weight/Low Vapor Pressure Liquid or Liquid/Solid Suspension Monomer Precursors; MRS Conference; Nov. 29-Dec. 3, 1998; Paper No. Y12.1.

De Gryse, R. et al., "Sputtered Transparent Barrier Layers," pp. 190-198.

Wong, C.P.; Recent Advances in IC Passivation and Encapsulation: Process Techniques and Materials; Polymers for Electronic and Photonic Applications; AT&T bell Laboratories; 1993; pp. 167-209.

Shi, M.K., et al., In situ and real-time monitoring of plasma-induced etching PET and acrylic films, Plasma and Polymers, Dec. 1999, 4(4), pp. 1-25.

Affinito, J.D. et al.; Vacuum Deposited Polymer/metal Multilayer Films for Optical Applications; Paper No. C1.13; International Conference on Metallurgical Coatings; Apr. 15-21, 1995; pp. 1-14.

Affinito, J.D. et al., "Vacuum Deposition Of Polymer Electrolytes On Flexible Substrates" Proceedings of the Ninth International Conference On Vacuum Web Coating, Nov. 1995, ed R. Bakish, Bakish Press 1995, pp. 20-36.

PCT International Search Report regarding International application No. PCT/US 99/29853 dated Mar. 3, 2000.

Yializis A., et al., "Ultra High Barrier Films" 43$^{rd}$ Annual Technical Conference Proceedings, Denver, Apr. 15-20, 2000, pp. 404-407.

Henry, B.M. et al., "Microstructural and Gas Barrier Properties of Transparent Aluminum Oxide and Indium Tin Oxide Films" 43$^{rd}$ Annual Technical Conference Proceedings, Denver, Apr. 15-20, 2000, pp. 373-378.

Affinito, J.D. et al.; Vacuum Deposition of Polymer Electrolytes on Flexible Substrates; The Ninth International Conference on Vacuum Web Coating; 1995; pp. 0-16.

Norenberg, H. et al.; Comparative Study of Oxygen Permeation Through Polymers and Gas Barrier Films; 43$^{rd}$ Annual Technical Conference Proceedings; Denver, Apr. 15-20, 2000; pp. 347-351.

Mahon, J.K. et al.; Requirements of Flexible Substrates for Organic Light Emitting Devices in Flat Panel Display Applications; Society of Vacuum Coaters; 42$^{nd}$ Annual Technical Conference Proceedings; Apr. 1999; pp. 456-459.

Tropsha et al.; Activated Rate Theory Treatment of Oxygen and Water Transport through Silicon Oxide/Poly(ethylene terphthalate) Composite Barrier Structures; J. Phys. Chem B Mar. 1997; pp. 2259-2266.

Tropsha et al.; Combinatorial Barrier Effect of the Multilayer SiOx Coatings on Polymer Substrates; Society of Vacuum Coaters; 40$^{th}$ Annual Technical Conferences Proceedings; Apr. 12-17, 1997; pp. 64-69.

Affinito, J.D. et al.; Ultra High Rate, Wide Area, Plasma Polymerized Films from High Molecular Weight/Low Vapor Pressure Liquid or Solid Monomer Precursors; 45$^{th}$ International Symposium of the American Vacuum Society; Nov. 2-6, 1998; pp. 0-26.

Felts, J.T.; Transparent Barrier Coatings Update: Flexible Substrates; 36$^{th}$ Annual Technical Conference Proceedings; Apr. 25-30, 1993 pp. 324-331.

Affinito, J.D. et al.; Molecularly Doped Polymer Composite Films for Light Emitting Polymer Application Fabricated by the PML Process, 41$^{st}$ Technical Conference of the Society of Vacuum Coaters; Apr. 1998; pp. 220-225.

Affinito, J.D. et al.; Vacuum Deposited Conductive Polymer Films; The Eleventh International Conference on Vacuum Web Coating; Nov. 9-11, 1997; pp. 0-12.

Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.

Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.

Bright, Clark I.; Transparent Barrier Coatings Based on ITO for Flexible Plastic Displays; Thirteenth International Conference on Vacuum Web Coatings; Oct. 17-19, 1999; pp. 247-255.

Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.

Akedo et al., "LP-5: Lake-News Poster: Plasma-CVD SiNx/Plasma-Polymerized CNx:H Multi-layer Passivation Films for Organic Light Emitting Diods", SID 03 Digest.

Chwang et al., "Thin Film encapsulated flexible organic electroluminescent displays", American Institute of Physics, 2003.

* cited by examiner

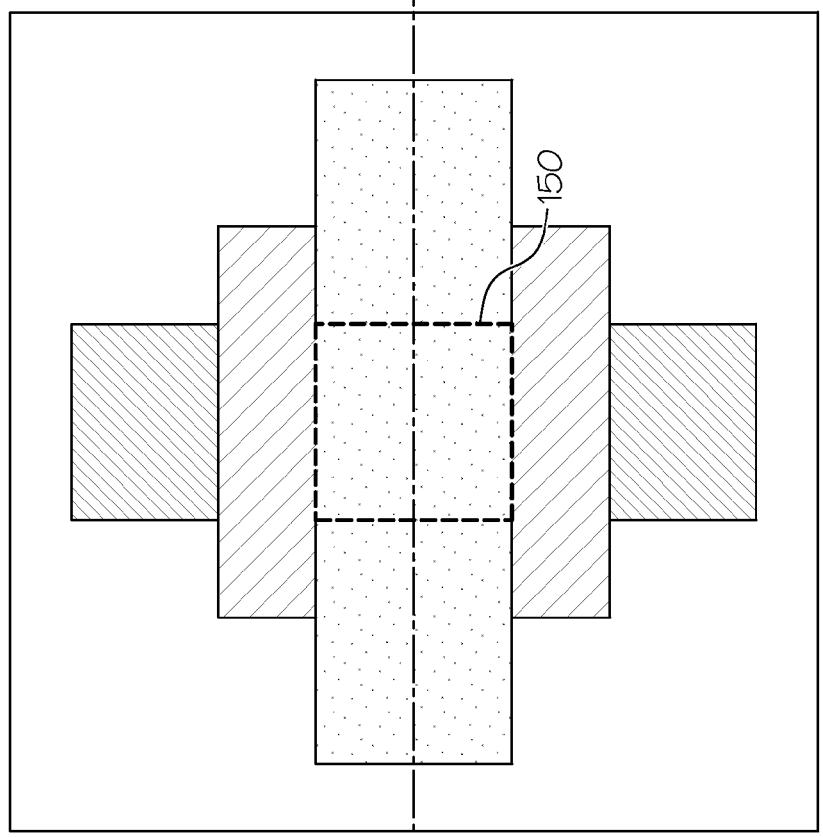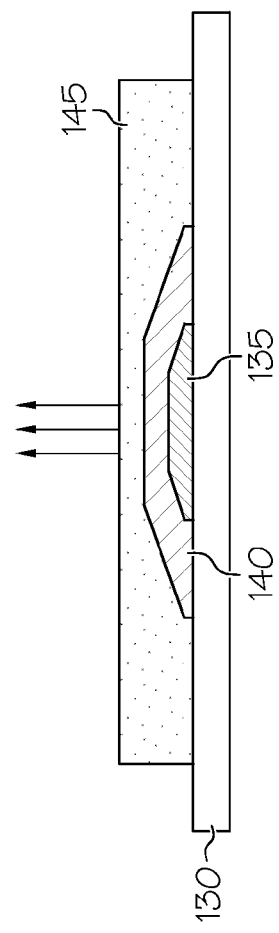

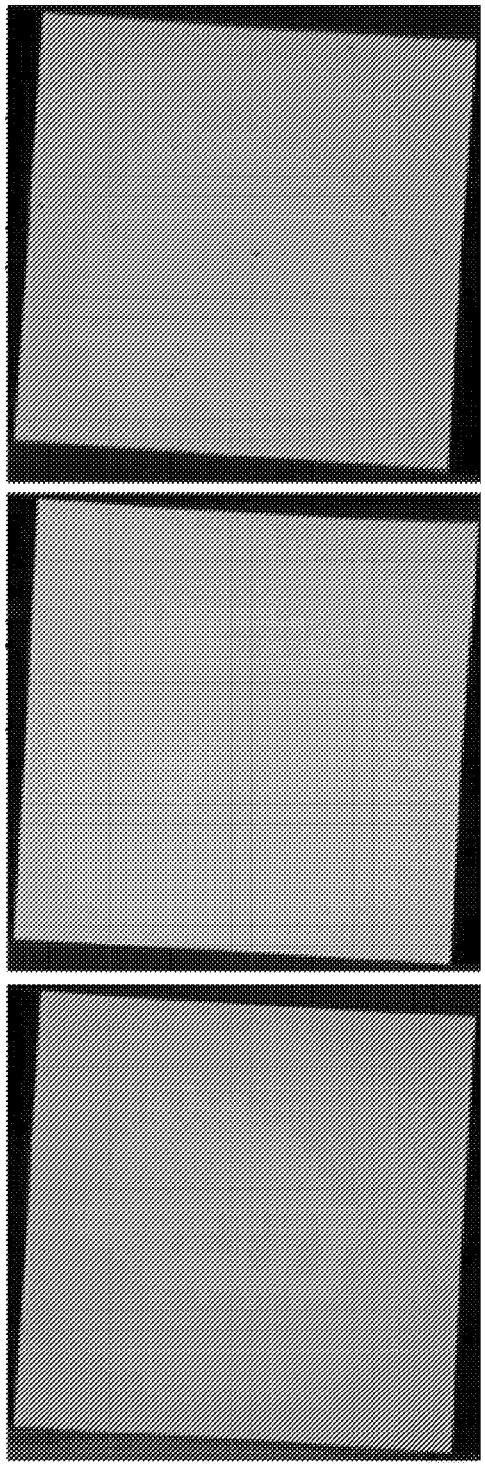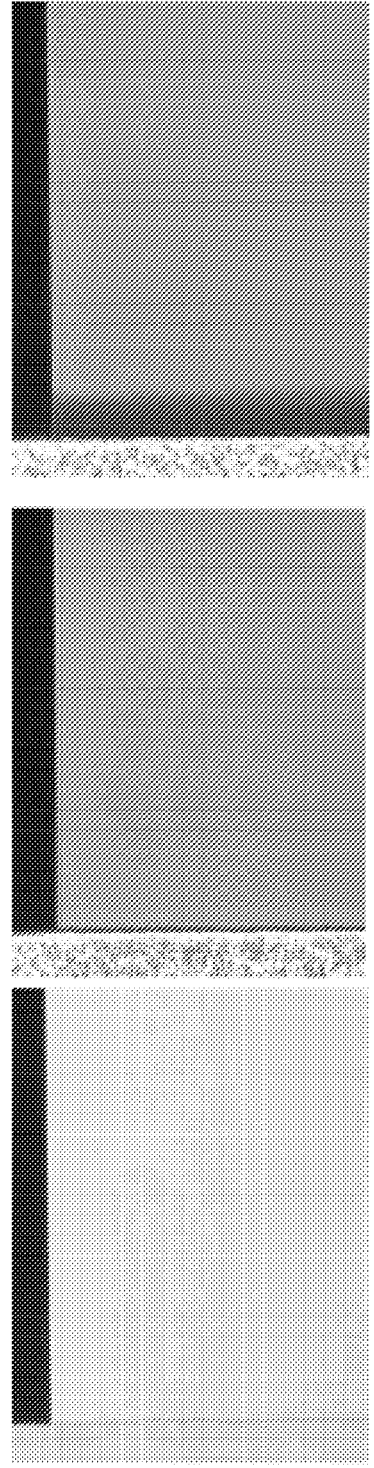
FIG. 5C(1) FIG. 5C(2)
FIG. 5B(1) FIG. 5B(2)
FIG. 5A(1) FIG. 5A(2)

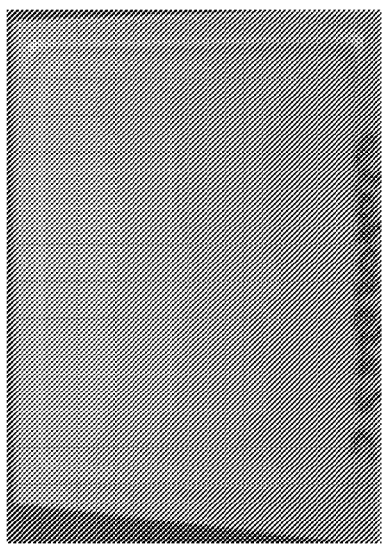
FIG. 12C(1)
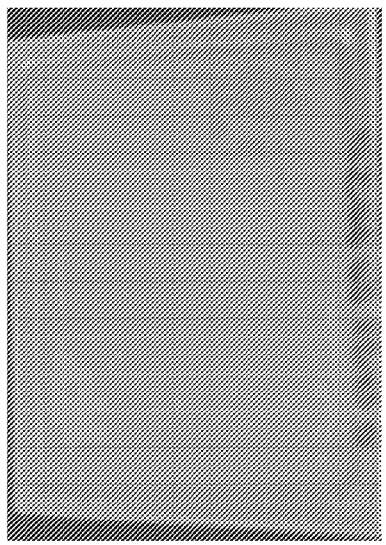
FIG. 12C(2)
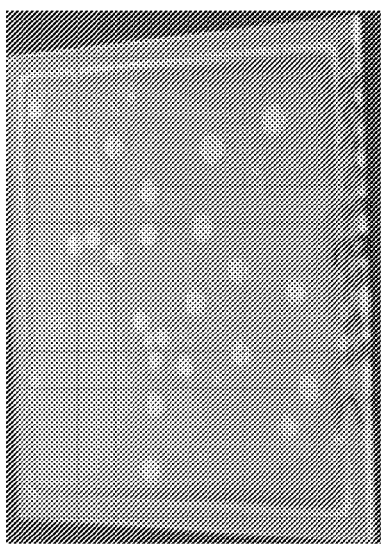
FIG. 12B(1)
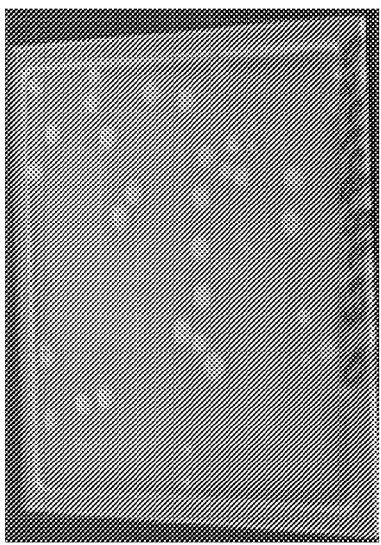
FIG. 12B(2)
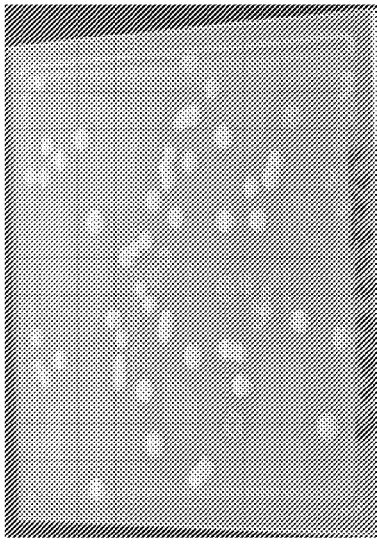
FIG. 12A(1)
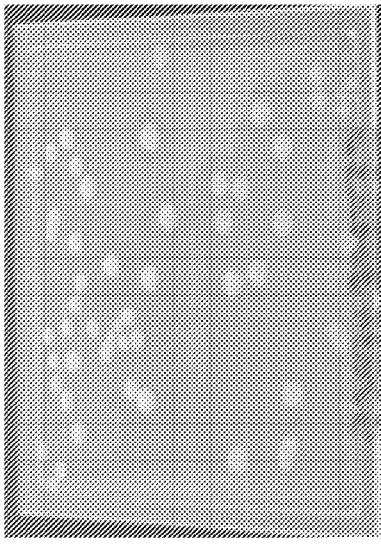
FIG. 12A(2)

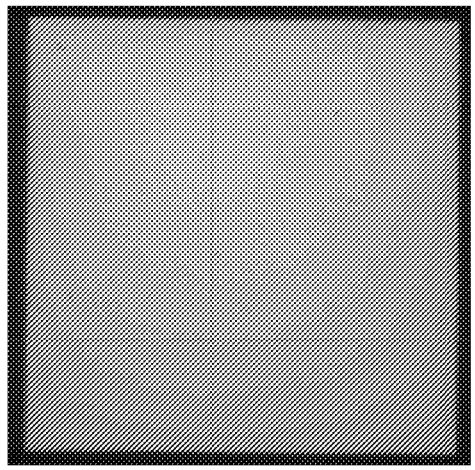
FIG. 16A(2)
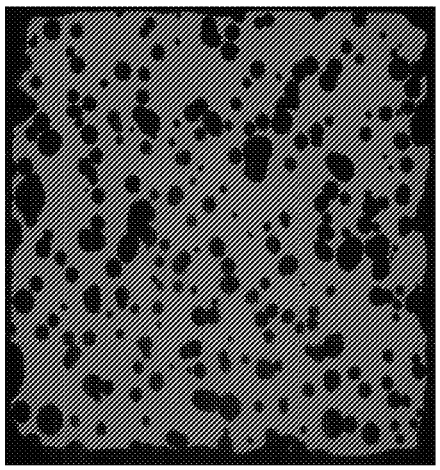
FIG. 16B(2)
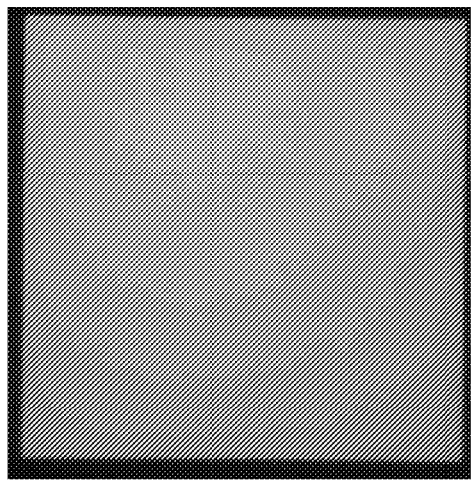
FIG. 16A(1)
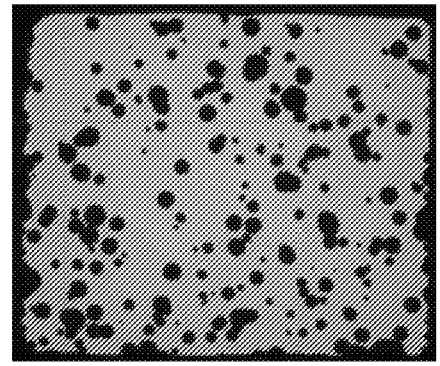
FIG. 16B(1)

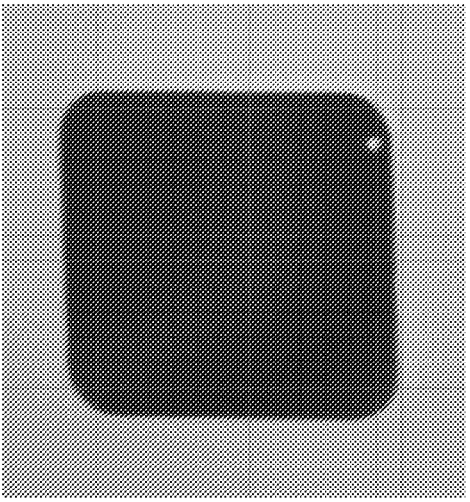
FIG. 17A(1)
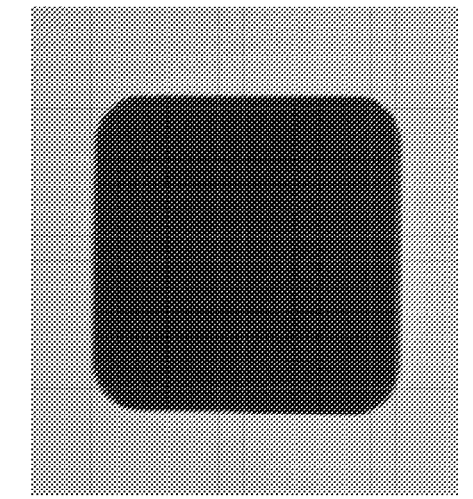
FIG. 17A(2)
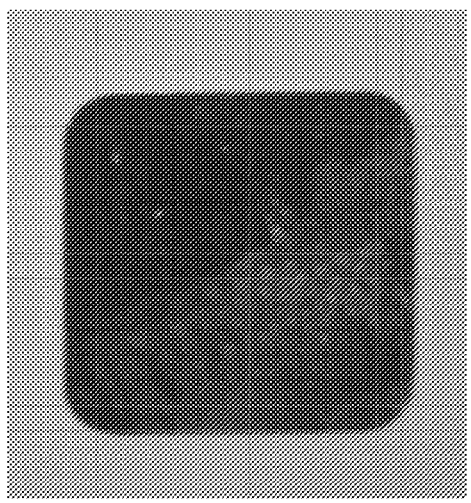
FIG. 17B(1)
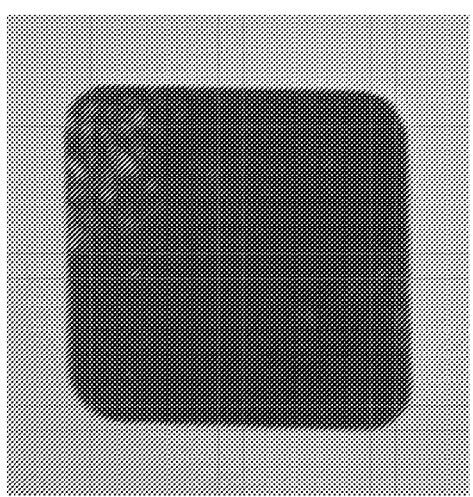
FIG. 17B(2)
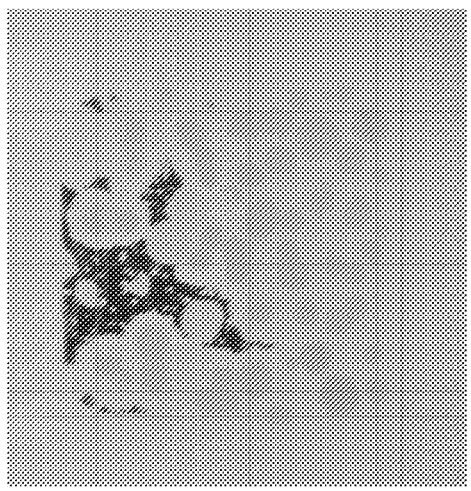
FIG. 17C(1)
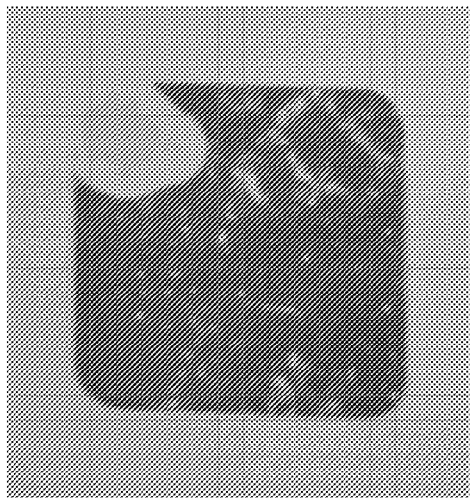
FIG. 17C(2)

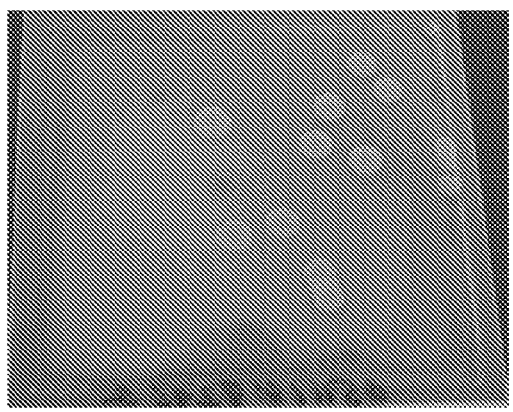 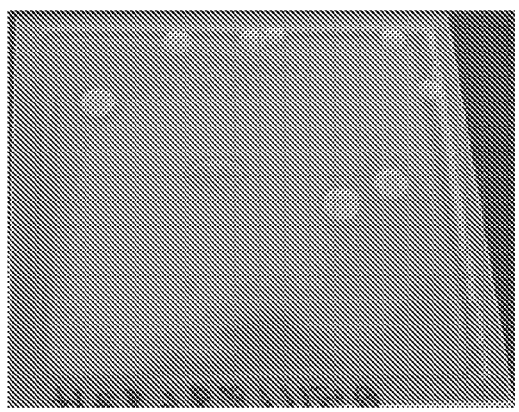
FIG. 19A(1)　　　　　　　FIG. 19A(2)
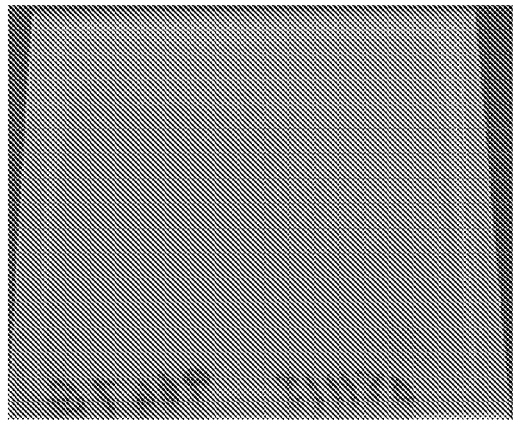 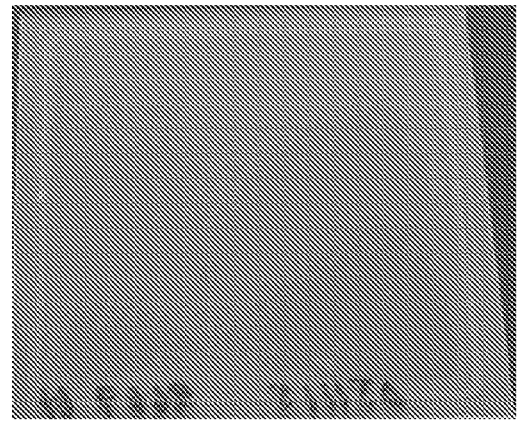
FIG. 19B(1)　　　　　　　FIG. 19B(2)
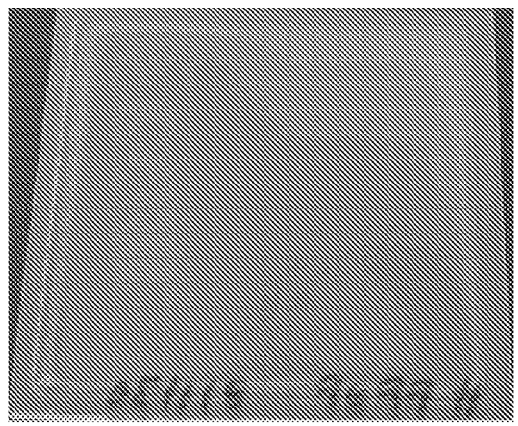 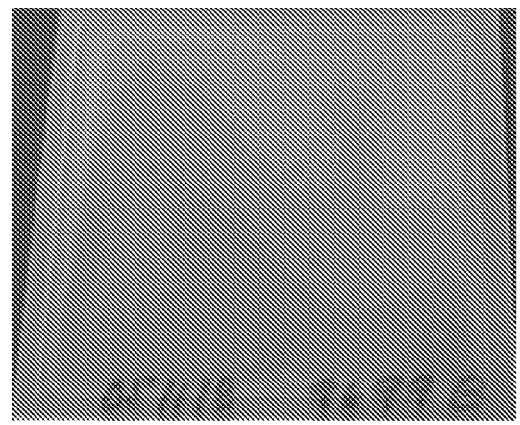
FIG. 19C(1)　　　　　　　FIG. 19C(2)

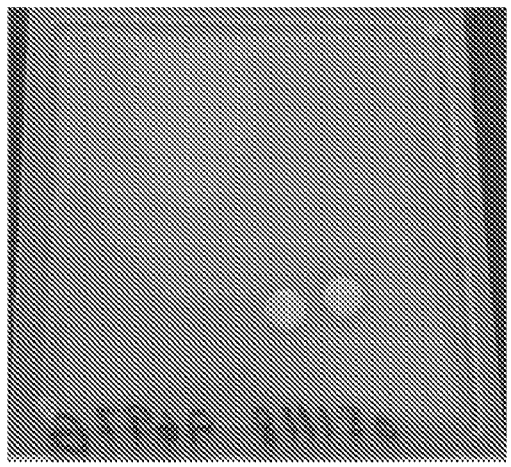
FIG. 19D(1)
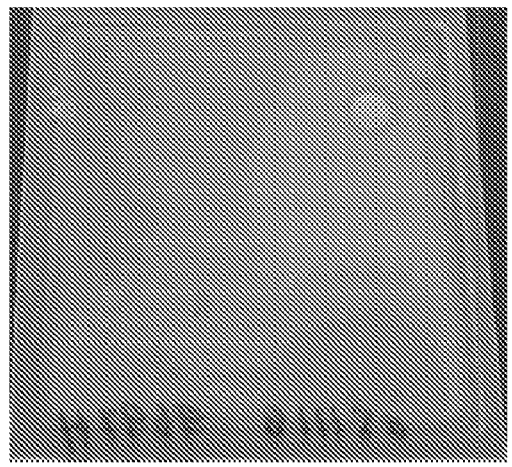
FIG. 19D(2)
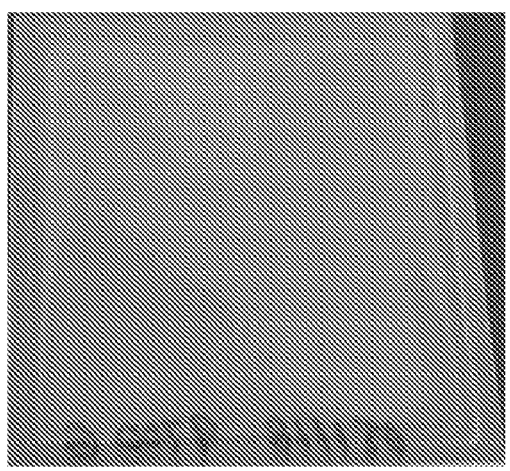
FIG. 19E(1)
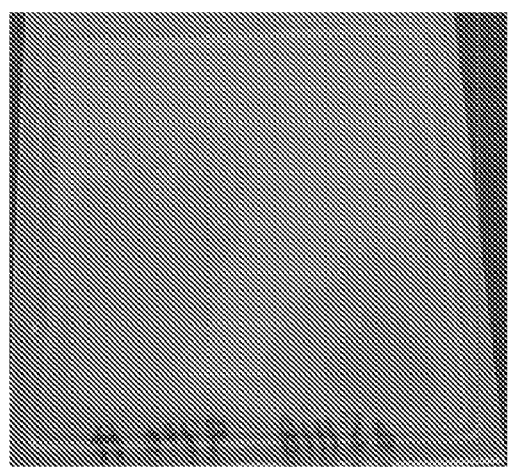
FIG. 19E(2)

MULTILAYER BARRIER STACKS AND METHODS OF MAKING MULTILAYER BARRIER STACKS

CROSS REFERENCE TO RELATED APPLICATIONS

This application is a continuation-in-part of application Ser. No. 11/439,474, filed May 23, 2006, entitled Method of Making an Encapsulated Plasma Sensitive Device, which is a continuation-in-part of application Ser. No. 11/112,880, filed Apr. 22, 2005, entitled Apparatus for Depositing a Multilayer Coating on Discrete Sheets, which is a continuation-in-part of application Ser. No. 10/412,133, filed Apr. 11, 2003, entitled Apparatus for Depositing a Multilayer Coating on Discrete Sheets, all of which are incorporated herein by reference.

BACKGROUND OF THE INVENTION

The present invention relates generally to multilayer barriers, and more particularly to multilayer barriers stacks having improved properties.

Many devices are subject to degradation caused by permeation of environmental gases or liquids, such as oxygen and water vapor in the atmosphere or chemicals used in the processing of the electronic product. The devices are usually encapsulated in order to prevent degradation.

Various types of encapsulated devices are known. For example, U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; and U.S. Pat. No. 6,570,325, entitled "Environmental Barrier Material For Organic Light Emitting Device And Method Of Making", issued May 27, 2003, all of which are incorporated herein by reference, describe encapsulated organic light emitting devices (OLEDS). U.S. Pat. No. 6,573,652, entitled "Encapsulated Display Devices", issued Jun. 3, 2003, which is incorporated herein by reference, describes encapsulated liquid crystal displays (LCDs), light emitting diodes (LEDs), light emitting polymers (LEPs), electronic signage using electrophoretic inks, electroluminescent devices (EDs), and phosphorescent devices. U.S. Pat. No. 6,548,912, entitled "Semiconductor Passivation Using Barrier Coatings," issued Apr. 15, 2003, which is incorporated herein by reference, describes encapsulated microelectronic devices, including integrated circuits, charge coupled devices, light emitting diodes, light emitting polymers, organic light emitting devices, metal sensor pads, micro-disk lasers, electrochromic devices, photochromic devices, microelectromechanical systems, and solar cells.

Generally, encapsulated devices can be made by depositing barrier stacks adjacent to one or both sides of the device. The barrier stacks typically include at least one barrier layer and at least one decoupling layer. There could be one decoupling layer and one barrier layer, there could be multiple decoupling layers on one side of one or more barrier layers, or there could be one or more decoupling layers on both sides of one or more barrier layers. The important feature is that the barrier stack has at least one decoupling layer and at least one barrier layer.

One embodiment of an encapsulated display device is shown in FIG. 1. The encapsulated display device 100 includes a substrate 105, a display device 110, and a barrier stack 115. The barrier stack 115 includes a barrier layer 120 and a decoupling layer 125. The barrier stack 115 encapsulates the display device 110, preventing environmental oxygen and water vapor from degrading the display device.

The barrier layers and decoupling layers in the barrier stack can be made of the same material or of a different material. The barrier layers are typically about 100-400 Å thick, and the decoupling layers are typically about 1000-10,000 Å thick.

Although only one barrier stack is shown in FIG. 1, the number of barrier stacks is not limited. The number of barrier stacks needed depends on the level of water vapor and oxygen permeation resistance needed for the particular application. One or two barrier stacks should provide sufficient barrier properties for some applications, while three or four barrier stacks are sufficient for most applications. The most stringent applications may require five or more barrier stacks.

The decoupling layers can be deposited using a vacuum process, such as flash evaporation with in situ polymerization under vacuum, or plasma deposition and polymerization, or atmospheric processes, such as spin coating, ink jet printing, screen printing, or spraying. Suitable materials for the decoupling layer include, but are not limited to, organic polymers, inorganic polymers, organometallic polymers, hybrid organic/inorganic polymer systems, and silicates.

The barrier layers can be deposited using a vacuum process, such as sputtering, chemical vapor deposition (CVD), metalorganic chemical vapor deposition (MOCVD), plasma enhanced chemical vapor deposition (PECVD), evaporation, sublimation, electron cyclotron resonance-plasma enhanced vapor deposition (ECR-PECVD), and combinations thereof. Suitable barrier materials include, but are not limited to, metals, metal oxides, metal nitrides, metal carbides, metal oxynitrides, metal oxyborides, and combinations thereof.

In general, the deposition of dense layers with suitable barrier properties is achieved by supplying energy to the species impinging on the substrate to form the layer. Such energy may be supplied as thermal energy. In some of the depositions mentioned above, more specifically the energy is supplied by using ionization radiation to increase the ion production in the plasma and/or to increase the number of ions in the evaporated material streams. The ionization radiation may be (UV) light, ion beam, electron beam, and electromagnetic field. The ions so produced are then accelerated to the substrate either by applying a DC or AC bias to the substrate, or by building up a potential difference between the plasma and the substrate.

We have found that some devices encapsulated with multilayer barrier stacks have been damaged by the plasma used in depositing the barrier and/or decoupling layers. Device plasma damage has occurred when a substrate with a plasma sensitive device on it, such as an OLED, is encapsulated with a multi-layer barrier stack in which a plasma based and/or assisted process is used to deposit a barrier layer and/or decoupling layer on the OLED. For example, device plasma damage has occurred when reactively sputtering a barrier layer of $AlO_x$ under conditions suitable for achieving barrier properties, sputtering a barrier layer of $AlO_x$ onto the top surface of a plasma sensitive device, and/or sputtering a barrier layer of $AlO_x$ on a vacuum deposited, acrylate based polymeric layer.

Device plasma damage associated with the use of plasma in the deposition of a barrier layer, a decoupling layer, or another layer on a device essentially has a negative impact on the electrical and/or luminescent characteristics of the encapsulated device. The effects will vary by the type of device, the structure of the device, and the wavelength of the light emitted by the OLED. It is important to note that device plasma damage is dependent on the design of the device to be encapsulated. For example, Olds made by some manufacturers show little to no device plasma damage, while Olds made by other manufacturers show significant device plasma damage under the same deposition conditions. This suggests that there are features within the device that affect its sensitivity to plasma exposure.

One way to detect this type of device plasma damage is to measure the voltage needed to achieve a specified level of luminescence. Another way is to measure the intensity of the luminescence. Device plasma damage results in higher voltage requirements to achieve the same level of luminescence (typically 0.2 to 0.5 V higher for an OLED), and/or lower luminescence.

Although not wishing to be bound by theory, device plasma damage that is observed when a decoupling layer employing plasma, a sputtered $AlO_x$, or another layer employing plasma is formed (deposited) directly on an OLED or other sensitive device is believed to be due to an adverse interaction between the device and one or more components of the plasma, including ions, electrons, neutral species, UV radiation, and high thermal input.

This type of device plasma damage and methods of reducing it are described in application Ser. No. 11/439,474, filed May 23, 2006, entitled Method of Making an Encapsulated Plasma Sensitive Device.

In addition, it is known that plasma treatments can modify the properties of polymers. Several patents disclose the use of plasma treatment to improve properties for a multilayer barrier on a substrate. U.S. Pat. No. 6,083,628 discloses plasma treatment of polymeric film substrates and polymeric layers from acrylates deposited using a flash evaporation process as a way to improve properties. U.S. Pat. No. 5,440,466 also discusses plasma treatment of substrates and acrylate layers to improve adhesion. The improvement in adhesion is the result of breaking chemical bonds and creating new chemical species on the surface of the substrate. On the other hand, it is known that, in some cases, plasma and/or radiation exposure degrades the functional properties of polymers (polymer plasma damage).

It would be desirable to eliminate processes which use plasma in manufacturing barrier stacks and/or devices including barrier stacks. However, avoiding such processes is not always possible.

Therefore, there is a need for improved deposition conditions that reduce or eliminate damage to the polymeric decoupling layer, and for multilayer barriers having polymeric decoupling layers with reduced damage.

SUMMARY OF THE INVENTION

This need is met by the improved barrier stack of the present invention. The barrier stack is made by the process of depositing the polymeric decoupling layer on a substrate; depositing a first inorganic layer on the decoupling layer under a first set of conditions wherein an ion and neutral energy arriving at the substrate is less than about 20 eV so that the first inorganic layer is not a barrier layer, wherein a temperature of the substrate is less than about 150° C.; and depositing a second inorganic layer on the first inorganic layer under a second set of conditions wherein an ion and neutral energy arriving at the substrate is greater than about 50 eV so that the second inorganic layer is a barrier layer.

Another aspect of the invention is a barrier stack made by the process of depositing the polymeric decoupling layer on a substrate; depositing an inorganic layer on the decoupling layer at first set of conditions wherein an ion and neutral energy arriving at the substrate is less than about 20 eV so that a first portion of the inorganic layer adjacent to the polymeric decoupling layer is not a barrier layer, wherein a temperature of the substrate is less than about 150° C., and changing to a second set of conditions wherein an ion and neutral energy arriving at the substrate is greater than about 50 eV so that a second portion of the inorganic layer is a barrier layer.

Another aspect of the invention is a method of reducing damage to a polymeric decoupling layer in a barrier stack. The method includes depositing the polymeric decoupling layer on a substrate; depositing a first inorganic layer on the decoupling layer under a first set of conditions wherein an ion and neutral energy arriving at the substrate is less than about 20 eV so that the first inorganic layer is not a barrier layer, wherein a temperature of the substrate is less than about 150°; and depositing a second inorganic layer on the first inorganic layer under a second set of conditions wherein an ion and neutral energy arriving at the substrate is greater than about 50 eV so that the second inorganic layer is a barrier layer.

Another aspect of the invention is a method of reducing damage to a polymeric decoupling layer in a barrier stack. The method includes depositing the polymeric decoupling layer on a substrate; depositing a first inorganic layer on the decoupling layer under a first set of conditions wherein an ion and neutral energy arriving at the substrate is less than about 20 eV so that the first inorganic layer is not a barrier layer, wherein a temperature of the substrate is less than about 150° C.; and depositing a second inorganic layer on the first inorganic layer under a second set of conditions wherein an ion and neutral energy arriving at the substrate is greater than about 50 eV so that the second inorganic layer is a barrier layer.

Another aspect of the invention is a method of reducing damage to a polymeric decoupling layer in a barrier stack. The method includes depositing the polymeric decoupling layer on a substrate; placing a screen between a target and the substrate; plasma depositing a first inorganic layer on the decoupling layer under conditions so that the first inorganic layer is not a barrier layer; and plasma depositing a second inorganic layer on the first inorganic layer so that the second inorganic layer is a barrier layer By "inorganic non-barrier layer" we mean an inorganic layer deposited using a process in which the ion and neutral energy arriving at the substrate is less than about 20 eV. By "inorganic barrier layer" we mean an inorganic layer deposited using a process in which the ion and neutral energy arriving at the substrate is greater than about 50 eV. By "substrate" we mean a substrate alone, the substrate with a device on it, or the substrate with a device on it, where there are one or more layers on the device. By "on" we mean directly next to with no intermediate layers. By "adjacent" we mean next to, but not necessarily directly next to. There can be additional layers between two adjacent layers.

BRIEF DESCRIPTION OF THE DRAWINGS

FIGS. 4A and 4C are top plan views of top emitting and bottom emitting OLED devices with a cross-electrode configuration, FIG. 4B is a cross-section of FIG. 4A along lines 4B-4B.

FIGS. 5A-5C are photographs comparing the use of an evaporated aluminum layer and a sputtered aluminum layer in a baffler stack.

FIGS. 12A-12C are photographs showing the effect of different plasma gas pressures on polymer damage.

FIGS. 16A-16B are photographs showing the effect of plasma gas pressure on barrier performance.

FIGS. 17A-17C are photographs showing the effect of the thickness of the inorganic non-barrier layer on the barrier performance.

FIGS. 19A-19E are photographs showing the effect of the thickness of the inorganic non-barrier layer.

DETAILED DESCRIPTION OF THE INVENTION

Figure 1:
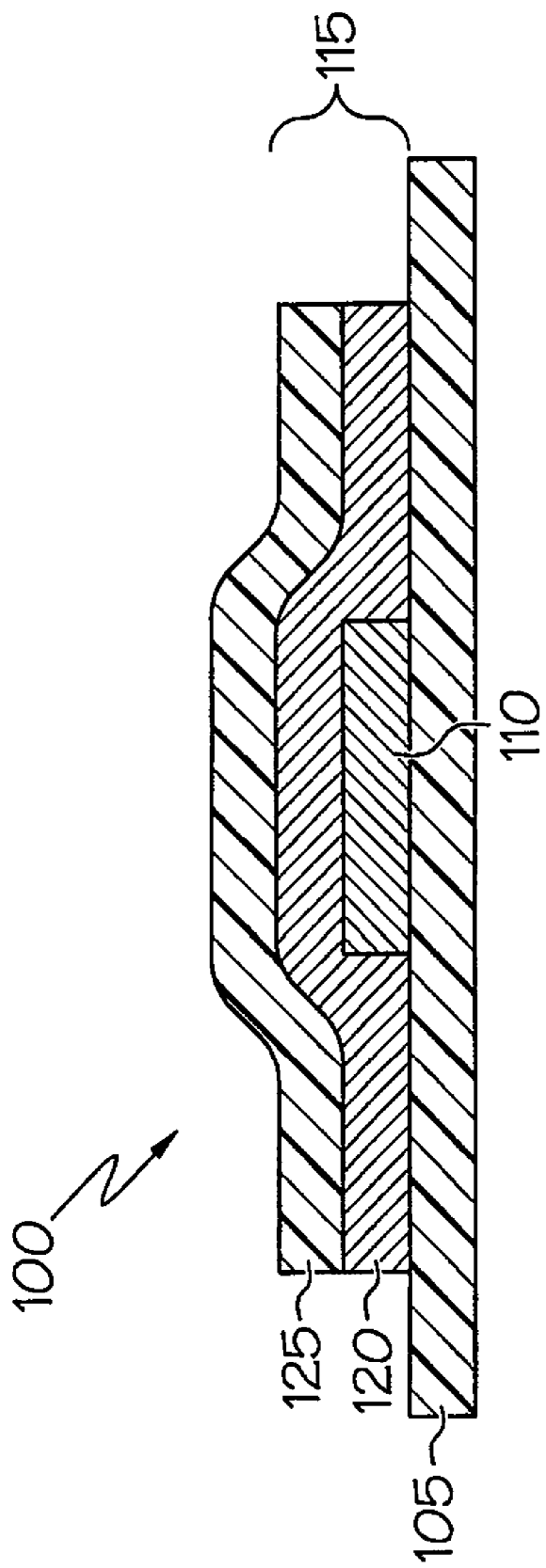
FIG. 1 is a cross-section of a portion of one embodiment of an encapsulated display device.

In addition to the device plasma damage to the environmentally sensitive device caused by the plasma used in depositing the barrier and/or decoupling layers, in some circumstances, the deposition of an inorganic barrier layer using plasma based process or other high energy process can cause damage to the polymer layer on which it is deposited. For example, when a barrier layer is deposited using a sputtering or reactive sputtering process, damage to the polymeric decoupling layer can result. For purposes of this discussion, we will refer to the damage to the polymeric decoupling layer by any high energy process as "polymer plasma damage." However, those having skill in the art will recognize that high energy processes include both plasma based processes and other high energy processes which do not involve the use of plasma. In the context of this discussion, by high energy processes, we mean processes in which ion and neutral energy arriving at the substrate is greater than about 50 eV.

Polymeric decoupling layers which have been damaged in this way generally have heteroatoms in the polymer backbone or sidechains which are susceptible to bond breakage. Examples of polymers which exhibit polymer plasma damage include, but are not limited to: 1. acrylates, particularly those incorporating alkoxy groups; 2. polysiloxanes, ranging from predominately linear (repeating $Si(CH_3)_2O$ units) to those that are highly branched (repeating $SiCH_3O_2$ units), including those resulting from plasma polymerization; 3. urethanes, particularly those based on polyalkoxy polyols or incorporating hybrid polyols based on polydimethylsiloxanes; 4. polyesters and epoxies, particularly those based on polyalkoxy polyols or incorporating hybrid polyols based on polydimethylsiloxanes; 5. thiols, and combinations thereof. As used herein, polyesters include the alkyd and unsaturated polyester subgroups.

Polymer plasma damage appears as black spots and/or gray halos. The black spots are non-emitting areas formed by the reaction of the organic light emitting materials and charge transport layers or the cathode interface layers (e.g., Ca, Ba, LiF, etc.) with reactive gaseous species that diffuse through pinholes in the metal cathode. In some cases, the non-emitting area (black spot) is surrounded by an area of reduced emission (gray halo). The reduction of emitting area by edge penetration of reactive species induced by lateral diffusion is associated with the formation of black spots and produced by the same phenomena. This is seen as the formation of a non-emitting dark edge in the illuminated pixel. The reactive species may be moisture, or oxygen, or possibly nitrogen or carbon dioxide, from the atmosphere diffusing to the layers because of encapsulation failure. We have also seen that black spots can develop in the absence of moisture and oxygen, or in general external gases, if volatile species are produced in the organic layer caused by damage to the polymer. Monitoring the growth of black spots and lateral edges in the absence of moisture or oxygen is therefore a good metric to evaluate the damage to the polymer layer. For this purpose, the OLED must be stored in a dry box or encapsulated by a metal or glass can with desiccant.

One way to improve the resistance of the polymeric decoupling layer is by selecting the polymer using a number of design criteria which help reduce damage. This approach is described in U.S. application Ser. No. 11/509,837, filed Aug. 24, 2006, entitled Encapsulated Devices And Method Of Making, which is incorporated herein by reference.

Another approach to reducing the damage to the polymeric decoupling layer is to protect the polymeric layer from the plasma employed in the process used to deposit the inorganic barrier layer. For example, if each polymeric decoupling layer is protected by a thermally evaporated LiF layer during the inorganic barrier layer deposition (i.e., a thermally evaporated film is deposited on the polymeric decoupling layer prior to plasma exposure), no significant growth of dark spots/halo is observed.

Figure 2B:
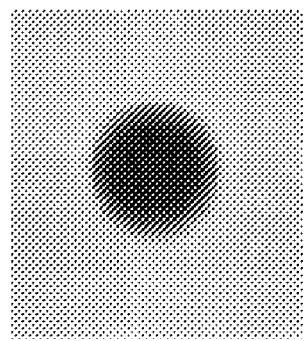
FIGS. 2A-2B are photographs showing the effect of a protective layer of LiF.
Figure 2A:
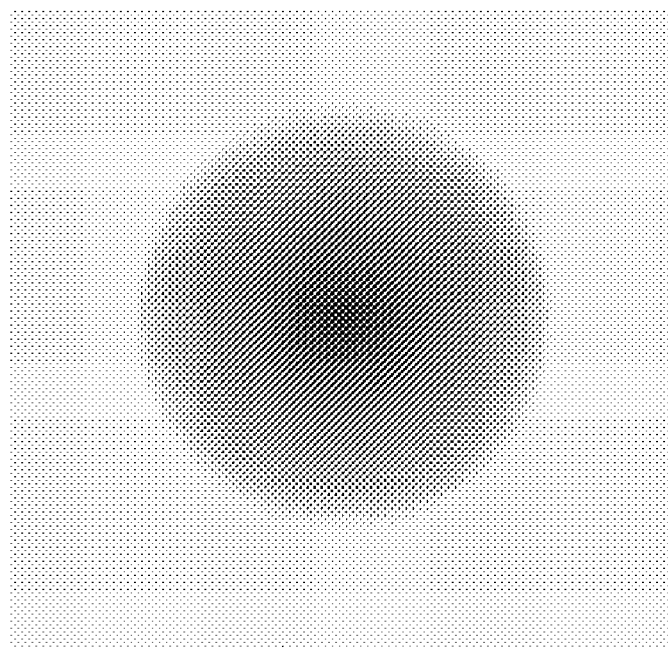
Figure 3:
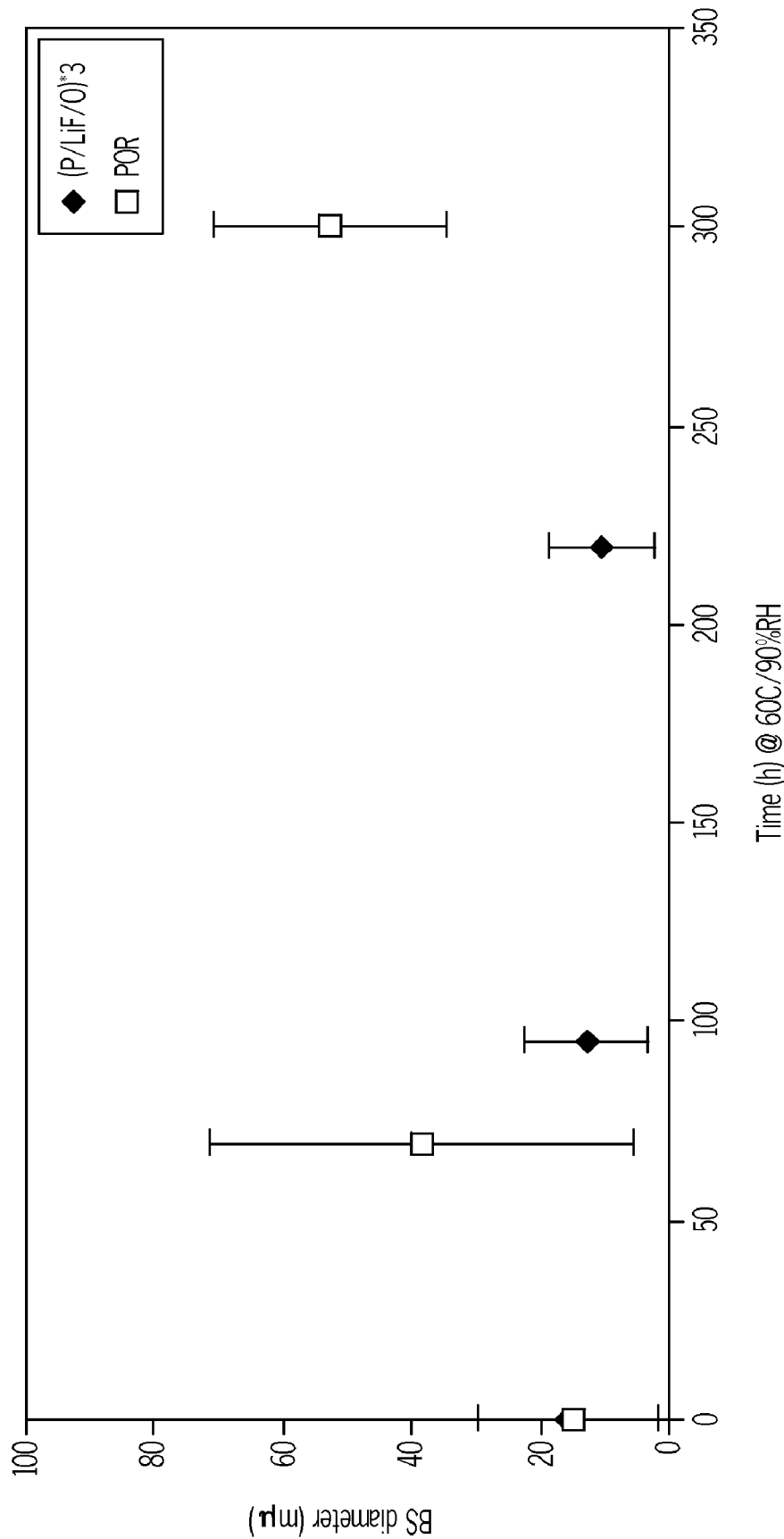
FIG. 3 is a graph showing the size of black spots over time.

An example of the dark spot/halo is shown in FIG. 2. The OLED in FIG. 2A was coated with a multilayer barrier stack comprising an acrylic polymer layer/LiF/$Al_xO_y$, and an acrylic polymer/$Al_xO_y$/acrylic polymer stack. Thus, one of the polymer layers was protected before deposition of the oxide layer, while the other was not. The OLED in FIG. 2B was coated with three multilayer stacks comprising acrylic polymer layer/LiF/$Al_xO_y$. Metal cans were applied over the barrier stacks for both Olds to exclude any contribution to the black spot/halo growth from moisture. A halo was observed around the defect in FIG. 2A, while no halo was observed in FIG. 2B, indicating that damage was avoided. In FIG. 3, the evolution over time (accelerated lifetime testing at 60° C./90% RH) of one defect similar to the one shown in FIG. 2B (black squares) is shown. The OLED device was coated with the same acrylic polymer layer/LiF/$Al_xO_y$ barrier structure as in FIG. 2B, and a metal can was applied over the barrier structure. The graph shows that there was no change in the black spot/gray halo size within the measurement experimental error. As a comparison the white square show the black spot growth for a typical process.

Figure 4C:
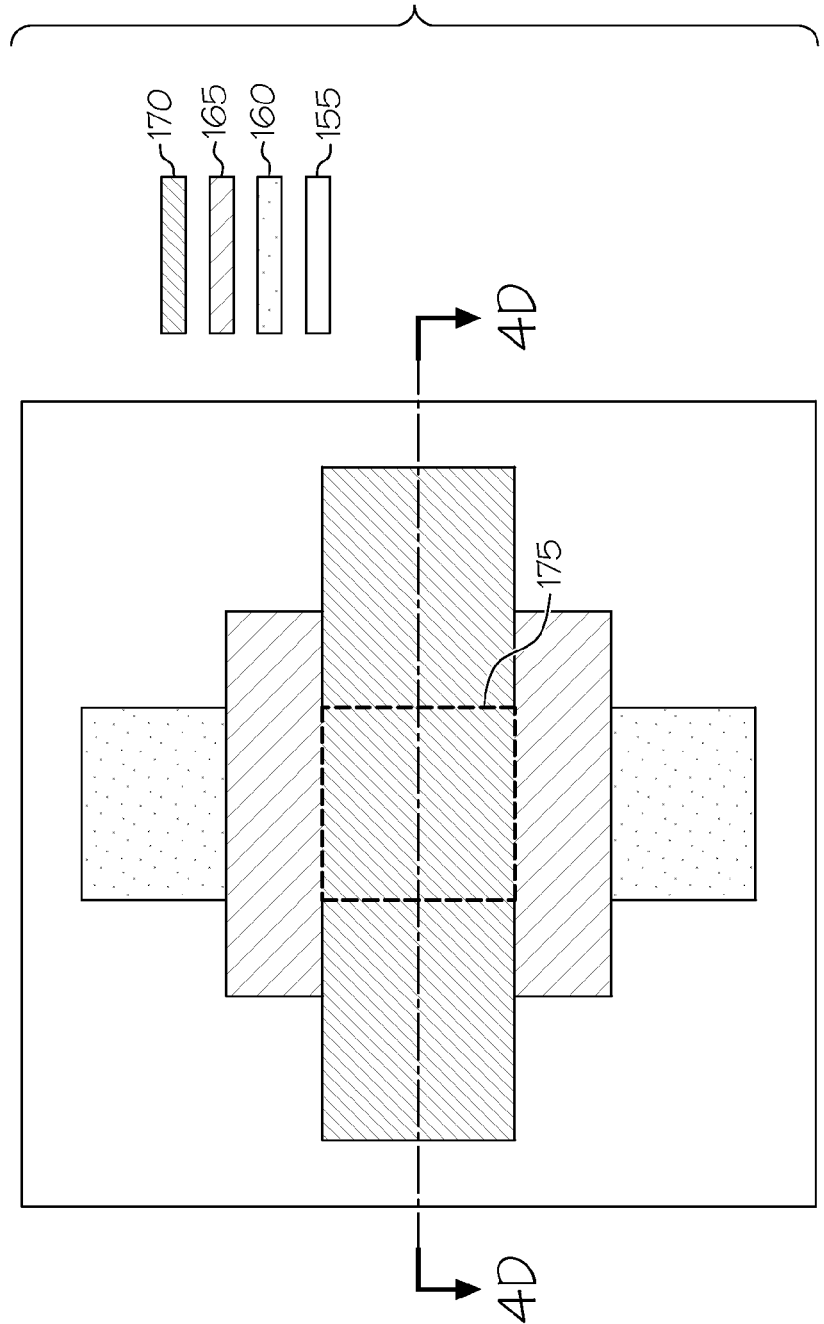
Figure 4D:
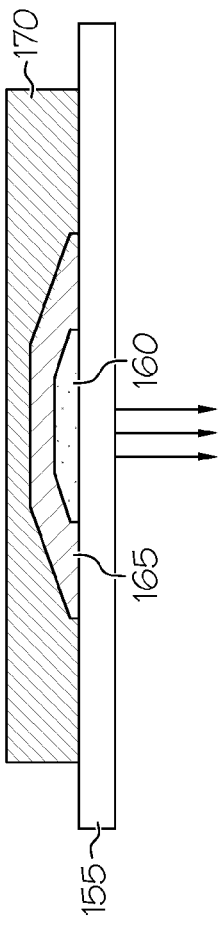
FIG. 4D is a cross-section of FIG. 4C along lines 4D-4D.

The source of the degradation of the polymeric decoupling layer was investigated using OLED devices with a cross-electrode configuration. An example of this type of device is shown in FIG. 4. FIGS. 4A and 4B shows a top emitting OLED. There is a substrate 130, a metal anode 135, a device 140, and transparent cathode 145. The OLED has an emitting area 150. FIGS. 4C and 4D show a bottom emitting OLED. There is a transparent substrate 155, a transparent conductor 160, a device 165, and a metal cathode 170. The OLED has an emitting area 175.

As illustrated in FIG. 4, deterioration in such devices due to diffusion of deleterious species from the top layers constituting the barrier will occur in correspondence of pinholes in the cathode, resulting in black spots surrounded by a gray halo, and by lateral diffusion perpendicular to the cathode resulting in a dark edge along the cathode direction.

An OLED was covered with an acrylic polymer layer and a metal can with desiccant. The device was aged for 500 h at RT. No black spots/halo were observed, and there was no darkening at the edge, as shown in FIG. 5A. This suggests that no damage is introduced by the direct interaction with the polymer, when the monomer blend is deposited as a liquid and properly cured (and the curing does not involve the use of a plasma). A second OLED (shown in FIG. 5B) was coated with an acrylic polymer layer and an evaporated Al film, encapsulated with a metal can and desiccant, and aged for 500 h at RT. This device showed no black spot growth. There was a dark edge less than 10 μm. The absence of black spots seems to exclude the possibility of a chemical interaction between the Al and the polymer as a cause of degradation. Also, the presence of the top Al layer acting as a barrier to outdiffusion of species excludes the possibility that deleterious species present in the polymer get outdiffused and gettered by the desiccant. FIG. 5C shows an OLED which was coated with an acrylic polymer layer and a sputtered Al film, encapsulated with a metal can and desiccant, and aged for 500 h at RT. There are black spots after aging, and a dark edge less than 50 μm developed. This suggests that the source of the damage to the polymeric decoupling layer is in the sputtering process, and that species originating in this process are the source of degradation for the OLED devices.

There are many possible mechanisms for damage to the polymeric decoupling layer when exposed to plasma during the sputtering process, including, but not limited to, the following:

Bombardment by high energy reflected neutral (hundreds of eV)

Bombardment by fast electrons in plasma (bulk 2-4 eV, up to 20-40 eV)

Bombardment by ions at plasma sheath around the substrate (<20 eV)

Exposure to ultraviolet light (<10 eV).

Experiments involving the deposition of a UV adsorbing layer on the OLED prior to the sputtering deposition of an oxide barrier layer on top of the polymer layer and experiments in which e-bombardment is reduced have shown no change in the degradation of the OLED emitting characteristics after polymer/oxide deposition and storage in dry environment. On the other hand, by varying significant deposition parameters during the oxide barrier layer deposition, we have shown that the high energy ions and neutrals reflected off the target are the main mechanism for polymer damage. In considering the damage to a polymer layer induced by the bombardment of the fast particles in a plasma, it is possible to alter the effect by acting on the flux and/or the energy of particles. For sputtering conditions of target power—2000 W, target voltage—350 V, target current—5.7 A, target area—310 $cm^2$, and pressure—2.5 mTorr, a flux of $2.4 \times 10^{17}/cm^2$ Ar ions arrives at the sputtering target with an estimated energy of 400 eV. Assuming 0.5% of reflection coefficient, about $1 \times 10^{15}$ ions/$cm^2$ Ar neutrals are reflected from the target surface. A large number of them can travel across the space between target and substrate and bombard the polymer film on the substrate. The energy of the neutrals will depend on the gas discharge pressure for the plasma and the target-to-substrate distance, as discussed below.

In the attempt to mitigate or avoid polymer plasma damage, three stages of the process on which is possible to operate may be identified:

Generation and reflection of high kinetic energy neutrals and ions on the surface of the sputtering target;

Transportation of the gas (e.g., Ar) high kinetic energy neutrals and ions to the polymer film surface;

Bombardment of the gas (e.g., Ar) high kinetic energy neutrals and ions on the polymer film surface.

In order to reduce and eliminate polymer plasma damage by high energy neutrals, a reduction of the flux density and the energy of the neutrals is needed. One aspect of the invention relates to methods to reduce and eliminate polymer plasma damage by acting on the plasma parameters and altering the neutral flux and neutral energy.

The flux density and the energy of the neutrals can be reduced at different stages in different ways.

High Kinetic Energy Neutral and Ion Generation Stage

Figure 6:
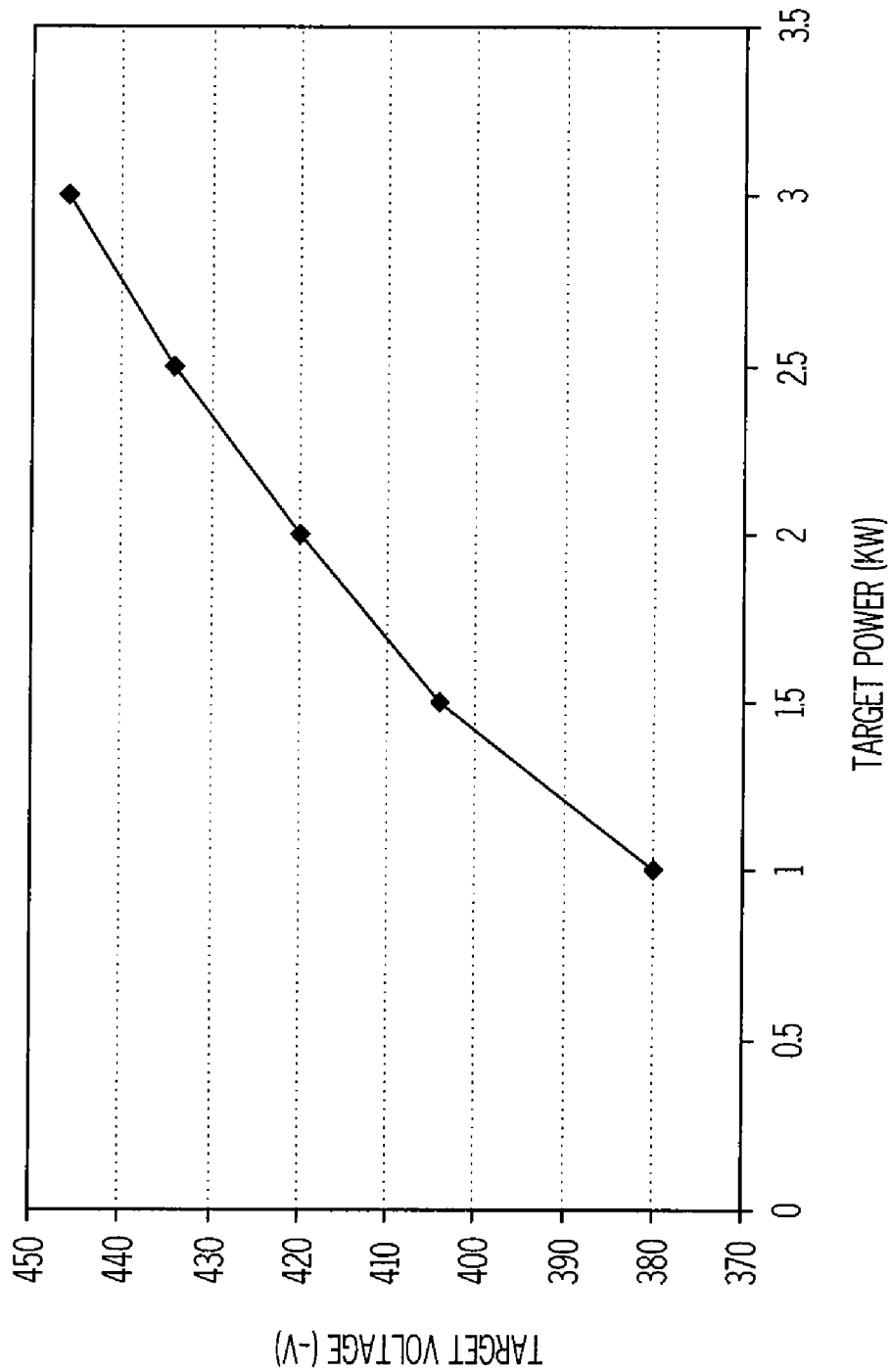
FIG. 6 is a graph showing target voltage v. target power.

The target voltage is typically in the range of −200 to −600 V. The negative potential attracts and accelerates Ar ions toward the target surface. The target voltage increases with the power used to ignite and sustain the plasma. Therefore, the cathode target power can be lowered in order to reduce the target voltage as illustrated in FIG. 6. However, lower power produces a lower plasma density which results in a lower deposition rate.

Figure 7:
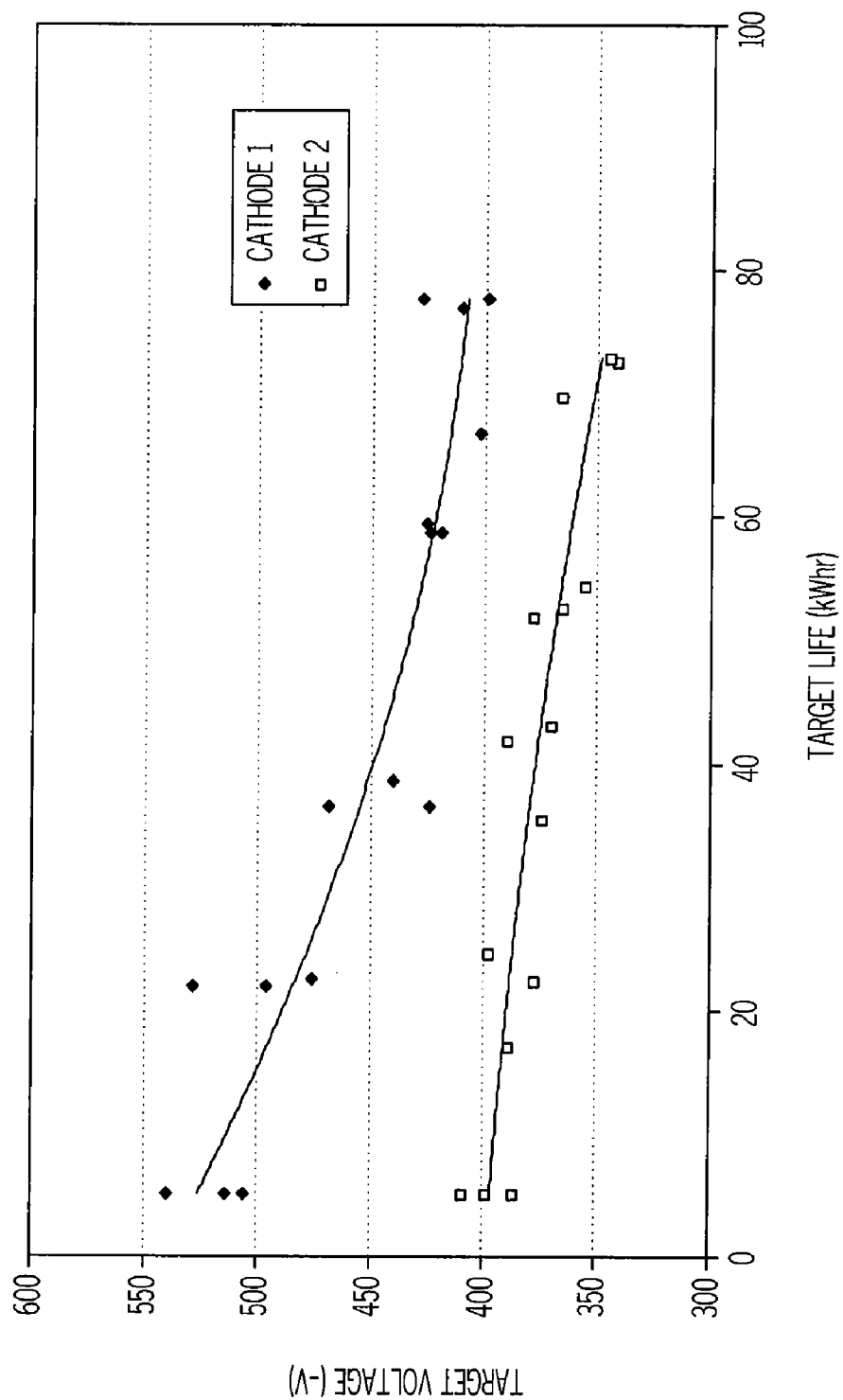
FIG. 7 is a graph showing target voltage v. target life for two cathode designs.

The sputtering cathode target voltage may be lowered while maintaining comparable plasma density by optimizing the magnetic field of the cathode (i.e., by optimizing the magnetron design and gas injection design). FIG. 7 compares two cathodes yielding the same plasma density, but having different target voltages. The two cathodes differ only in the intensity and the uniformity of the magnetic field. The stronger magnetic field traps electrons closer to target surface and increases the Ar ionization probability, resulting in a decrease in target voltage.

At a given power, the energy of the neutrals may be reduced by using a sputtering gas with a different mass and different sputtering target materials. The energy and reflection coefficient of Xe ions are both lower than those of Ar ions on an Al target surface.

2) High Kinetic Energy Neutral and Ion Transportation Stage

Figure 8:
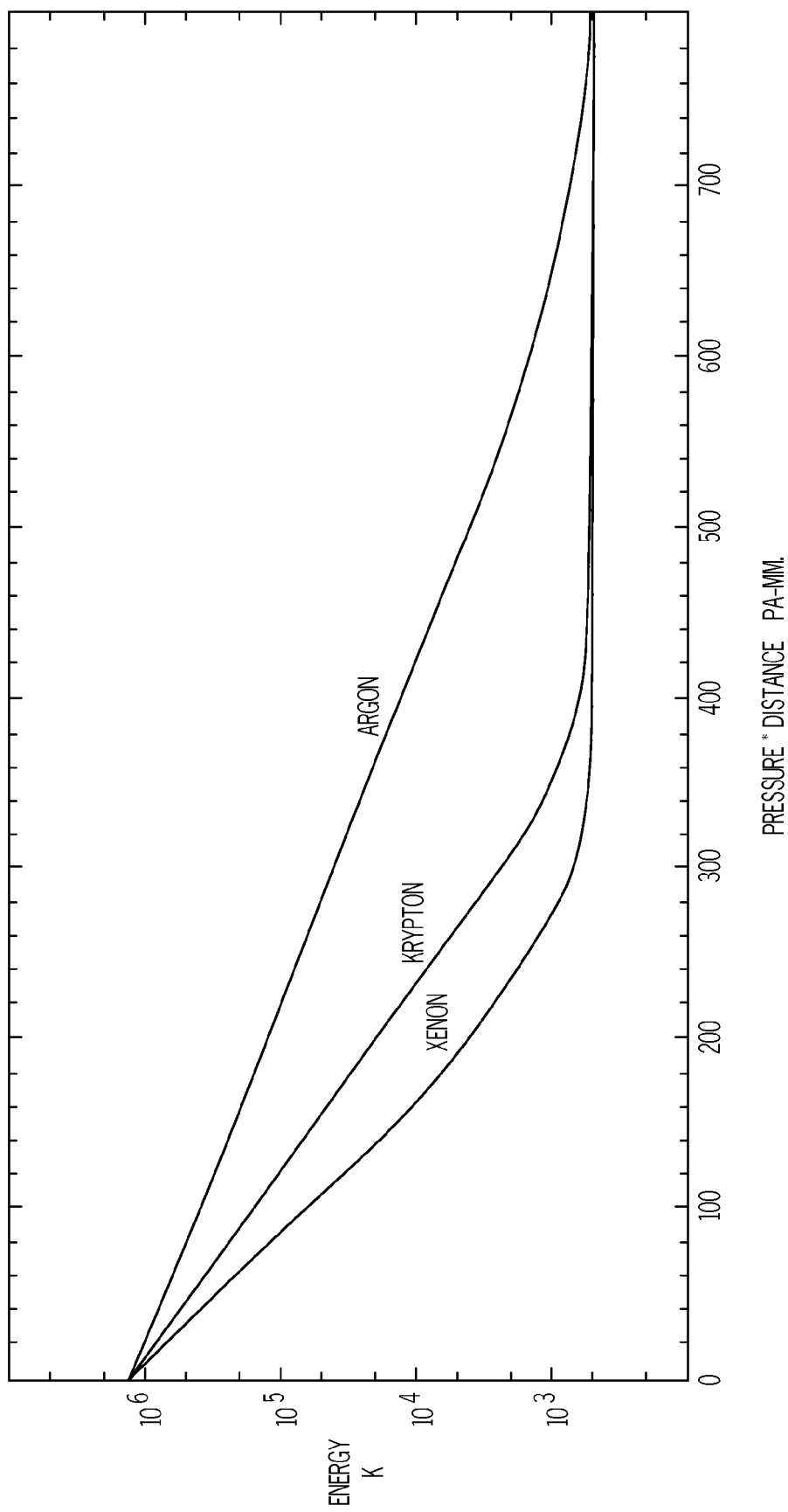
FIG. 8 is a graph showing the energy of reflected neutrals as a function of pressure times distance for various plasma gases.

The Ar neutrals bounced off the target exchange momentum with the Ar ions (and neutrals) present in the plasma. The neutrals lose energy and get scattered in different directions because of the collisions with the Ar atoms. By increasing the pressure (P) of the gas used to create the plasma discharge and/or the target-to-substrate distance (D), the energy of the neutrals impacting at the polymer surface will be lowered, and the impact will occur at lower angle, therefore resulting in a shallower damage zone. FIG. 8 shows theoretical calculation of Ar energy with the product of pressure and distance (PD). The impact can be reduced further by using an alternate sputtering gas, such as Kr or Xe.

Figure 9B:
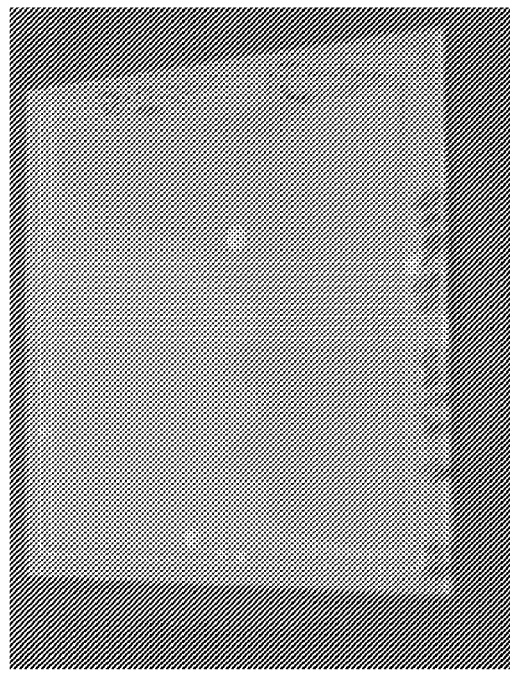
FIGS. 9A-9B are photographs showing the effect of the presence of a screen during deposition of a barrier layer.
Figure 9A:
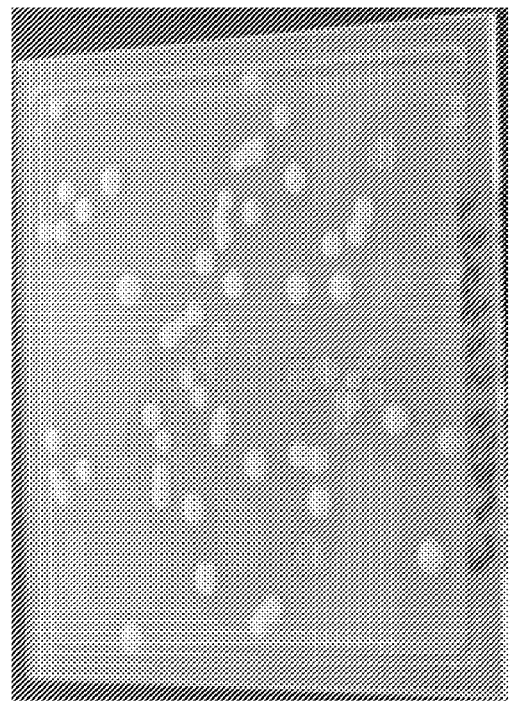

The insertion of a screen (for example, a screen with 40% openings, and ⅛ in. diameter holes) between the target and the substrate confines the plasma and limits the neutral flux reflected from the target to the substrate. One way to evaluate polymer plasma damage is to expose a barrier stack which has previously been exposed to plasma to UV/ozone (28,000 µWatts/cm² at 254 nm). Severe bubbling after exposure to UV/ozone for 15 min for a barrier stack is indicative of pre-existing damage to the polymer induced by the plasma deposition, while fewer or no bubbles appearing following UV/ozone exposure in the same conditions indicates lesser or no damage in the polymer layer. FIG. 9 compares two samples where the oxide layer was deposited on the polymer layer under comparable plasma conditions (A) without a screen and (B) with a screen. After deposition, the samples were subjected to the UV ozone test. It is apparent from the lower number of bubbles that a significant reduction in polymer plasma damage is obtained when the screen is used.

Figure 10A:
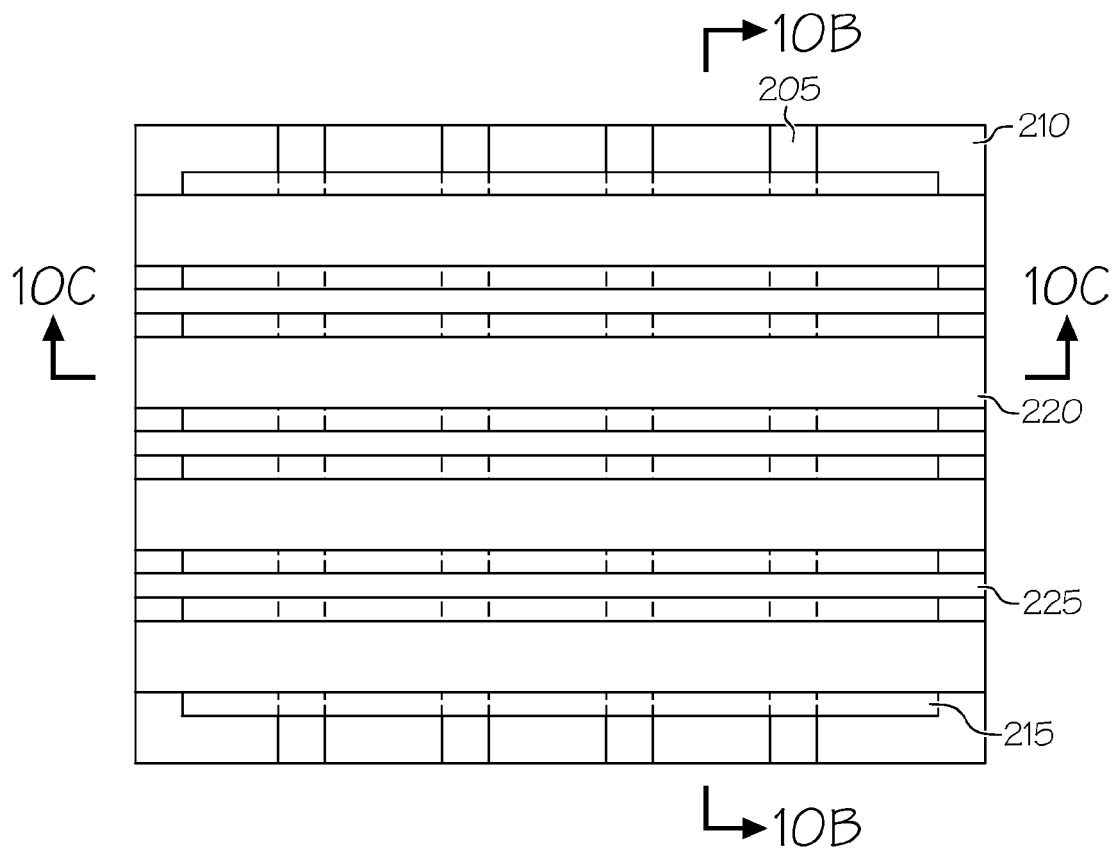
FIG. 10A is a top plan view of a passive matrix device.
Figure 10B:
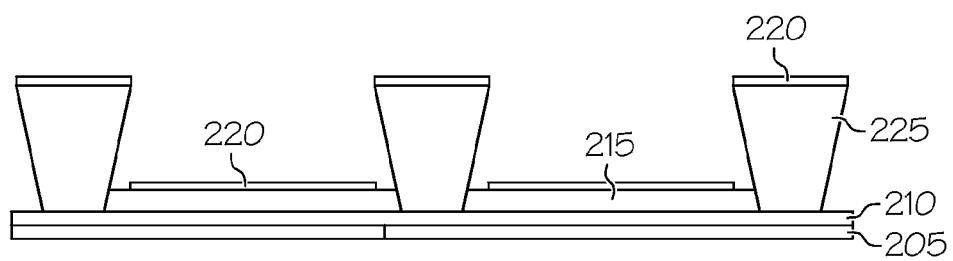
FIGS. 10B and 10C are cross-sections of the passive matrix device of FIG. 10A along lines 10B-10B and 10C-10C.
Figure 10C:
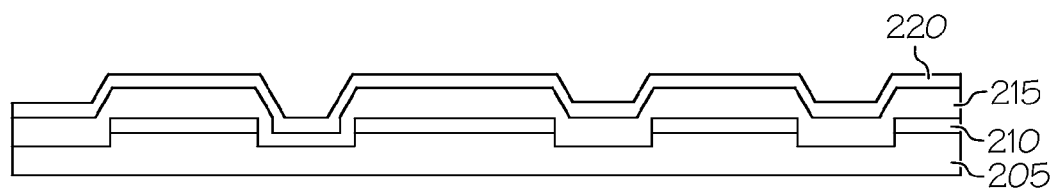

In passive matrix (PM) displays, reactive species generated by the partial decomposition of the polymer by plasma exposure diffuse to the sensitive areas of the device near the edges of the cathode. The reason for this is easily understood looking at the schematic drawing of the device shown in FIG. 10. A glass substrate 205 is covered with a layer of indium tin oxide (ITO) 210. The ITO layer 210 is removed from portions of the device. There is a polymer light-emitting diode/poly-ethylenedioxythiophene (PLED/PDOT) layer 215 over the ITO layer 210. The aluminum cathode layer 220 is over the PLED/PDOT layer 215. There are cathode separators 225 which separate the aluminum cathode layer 220.

Figure 11A:
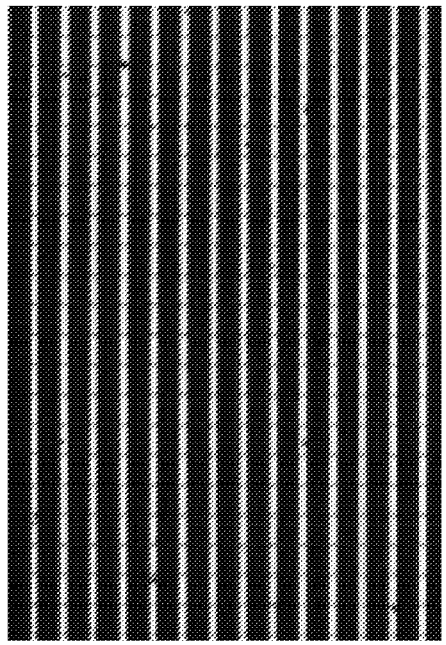
FIGS. 11A-11D are photographs showing the effect of different combinations of pressure times distance on polymer damage.
Figure 11B:
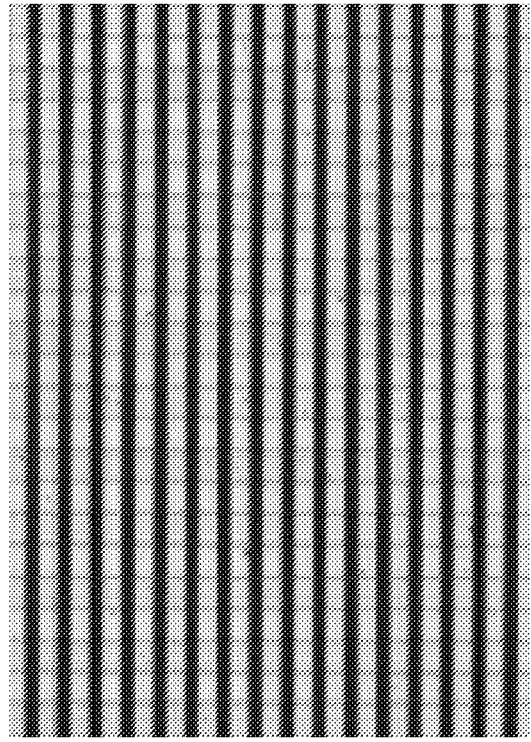

In this type of device, the cathode extends continuously in the direction 10C-10C, and therefore diffusion inside the pixel can occur only in the direction 10B-10B. FIG. 11 shows 4 PM devices coated with a multilayer barrier stack (aluminum oxide and acrylate) and stored in a dry box to eliminate any possibility of degradation by moisture. FIG. 11A shows the image of a non-coated device as a reference. The pixels in the coated plates were about 220 µm long and 180 µm wide as received, due to some degradation which occurred during transportation. The multilayer barrier layer stacks were deposited using different combinations of cathode-to-substrate distance D and gas pressure P for the plasma deposition of the aluminum oxide layer. FIGS. 11B (PD=19), 11C (PD=39), and 11D (PD=78) show devices after 100 h in dry box. All of the pixels showed noticeable shrinkage compared to the original size shown in FIG. 11A. However, with increasing PD values, the pixel area comes closer to the original value.

FIG. 12 shows polymer plasma damage as measured with the UV ozone method in multilayer barrier stacks using different Ar pressures for the oxide layer deposition. FIG. 12A was deposited at a pressure of 2.5 mTorr (PD=53), FIG. 12B was deposited at a pressure of 5.0 mTorr (PD=106), and FIG. 12C was deposited at a pressure of 10 mTorr (PD=213) (the target-to-substrate distance was held constant at 160 mm.). All of the samples were exposed to the UV ozone test. The number of bubbles decreased as a function of increasing pressure, with no damage appearing at 10 mT.

3) High Kinetic Energy Neutral and Ion Bombardment Stage

Direct bombardment of the polymer layer by accelerated particles present in the plasma, among them reflected neutrals, may be responsible for the breaking of weaker bonds in the polymer structure and the formation of potentially harmful mobile species that can migrate and react with the materials forming the OLED device.

The penetration of accelerated particles in the polymer layer was evaluated using TRIM simulation, which is a Monte Carlo ion-solid interactions code. It is widely used for calculation of ion implantation profiles and in ion beam analysis problems. A full description of the calculation is found in "The Stopping and Range of Ions in Solids", by J. F. Ziegler, J. P. Biersack and U. Littmark, Pergamon Press, New York, 1985, which is incorporated herein by reference.

Figure 13B:
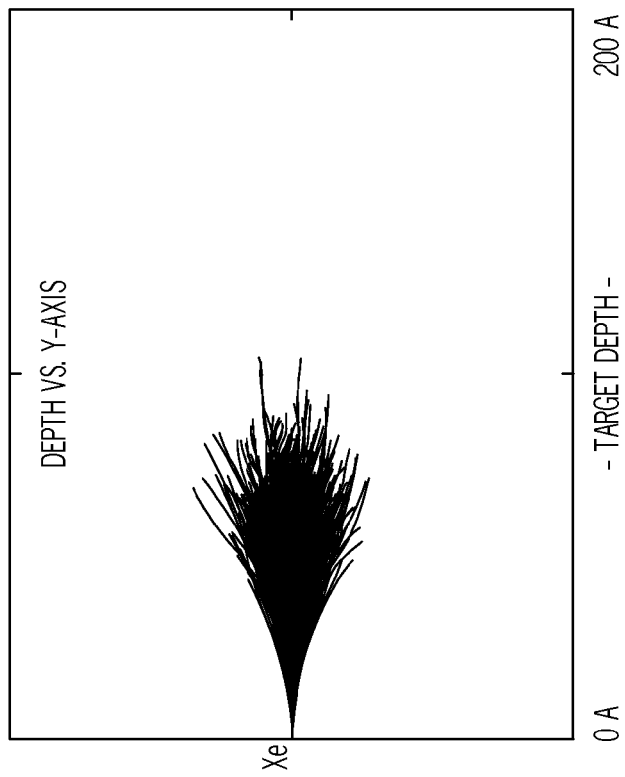
FIGS. 13A-13B are Monte Carlo simulations done using the TRIM code and showing damage for Ar v Xe.
Figure 13A:
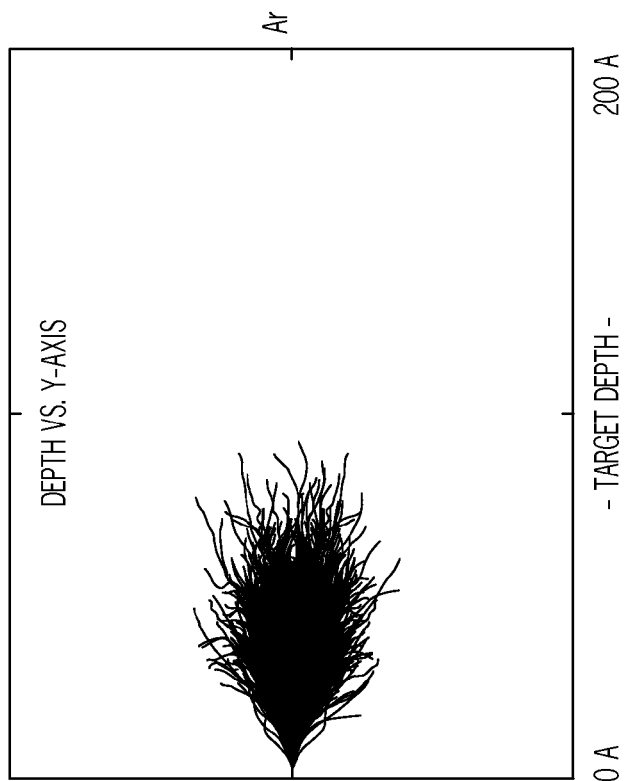

The TRIM simulation (FIG. 13) shows that the depth of penetration of the accelerated particles is in the range of about 200 Å for Ar at 400 eV with normal incidence. However, the thickness of the damaged layer may be greater than the penetration range due to the collision cascade produced by displacement of atoms in the bombarded layer. The polymer should be protected from ion/neutral damage by depositing a layer on the surface of the polymer with a thickness slightly greater than about 200 Å. To avoid the damage completely, the layer should be thicker than the penetration range. The effective thickness is defined by the impinging particle energy, its charge, and the mass and atomic number of the projectile and substrate. A safe range is to double the penetration range.

An evaporated inorganic or organic layer may be used as a protective layer. One embodiment of this concept using an evaporated LiF layer was described above, and the results are shown in FIG. 2.

Figure 11C:
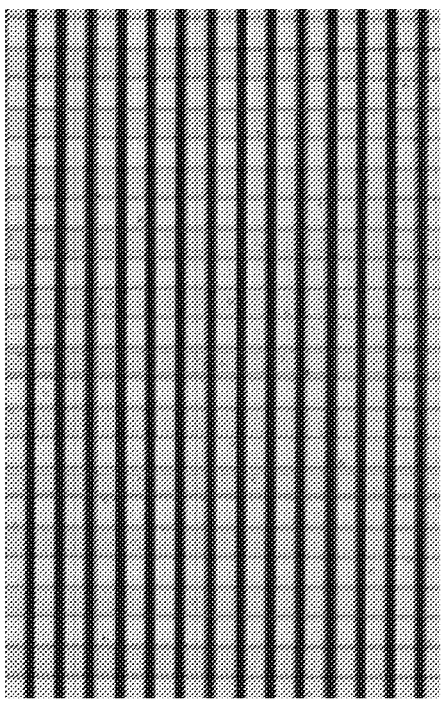
Figure 11D:
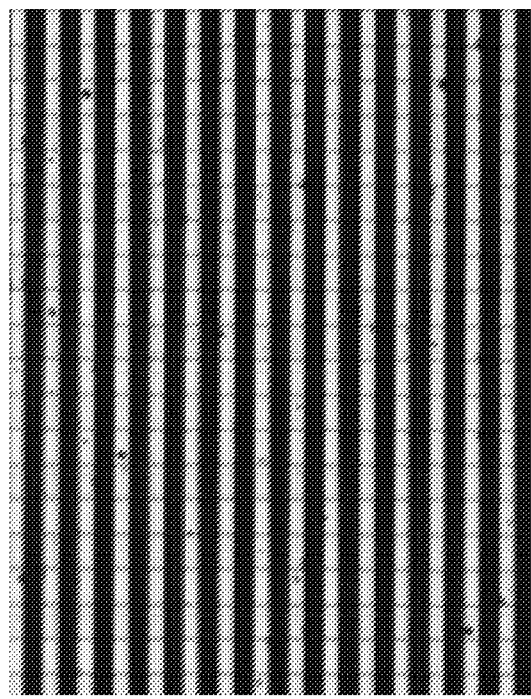

An oxide layer deposited using a plasma process under non-damaging conditions, e.g., by using a configuration with high PD (with P and D as defined above) may also protect the polymer from the damage produced by oxide deposition in high energetic plasma conditions. An example of this type of protective layer is shown in FIG. 11. As discussed above, PM displays were partially coated with an oxide/polymer structure where the oxide layer was deposited in configurations with different PD values (FIG. 11B-PD=19; FIG. 11C-PD=39; FIG. 11D-PD=78). A non-coated device is shown in FIG. 11A for reference. The damage appears as a decrease in the width of the illuminated area, showing the shrinkage of the effective pixel area. FIG. 11D, in which the oxide layer was deposited using the highest PD value (78 Pa mm), has the least pixel shrinkage.

Non-damaging conditions can also be defined using the ion and neutral energy arriving at the substrate, which will generally be less than about 20 eV, as discussed below.

c) As an extension of this concept, any inorganic layer deposited by a method not involving an energetic plasma may be implemented. Mild and energetic plasma conditions are discussed below. Among the types of depositions not involving an energetic plasma are included remote-plasma configurations, facing cathode configurations, inductively coupled plasmas. Other processes, such as evaporation, chemical vapor deposition, and atomic layer deposition, do not involve the use of a plasma at all.

To summarize, methods of avoiding polymer plasma damage during plasma deposition include one or more of the following: increased plasma discharge pressure, increased target-to-substrate distance, a combination of these, the use of a screen between the plasma and the substrate, and the use of a protective layer.

With respect to the increased plasma discharge pressure and increased target-to-substrate distance, for the following sputtering conditions: target power—2000 W; target voltage—350 V; target current—5.7 A; target area—310 $cm^2$; and argon gas; we found that increasing the plasma discharge pressure from 2 mTorr to 10 mTorr and increasing the target-to-substrate distance from 50 mm to 160 mm provided an inorganic layer which did not damage the underlying polymer layer. We found that for argon gas, a configuration of hardware/process parameters leading to PD values of greater than about 100 Pa*mm leads to thermalization of neutrals, and therefore would be acceptable.

Based on FIG. 8, and assuming the initial energy of ions leaving the sputter target surface is 110 eV, with the mild plasma conditions (i.e., target to substrate distance=160 mm and P=10 mTorr, P*D=213 Pa*mm), the ion and neutral energy arriving at the substrate due to loss of gas scattering will be 11 eV for Ar gas, and 1.4 eV for Kr gas. For the more energetic conditions (target to substrate distance=58 mm and P=2.5 mTorr, P*D=19 Pa*mm), the ion and neutral energy arriving at the substrate due to loss of gas scattering will be 90 eV for Ar gas, and 81 eV for Kr gas.

Typically, for the mild plasma conditions, the plasma gas discharge pressure is at least about 4 mTorr, or at least about 5 mTorr, or at least about 7 mTorr, or at least about 10 mTorr. Typically, the target-to-substrate distance is at least about 100 mm, or at least about 125 mm, or at least about 150 mm. Typically, the PD value is at least about 100 Pa*mm, or at least about 150 Pa*mm, or at least about 200 Pa*mm, For the more energetic barrier plasma conditions, the plasma gas discharge pressure is typically about 3.5 mTorr or less, or about 2.5 mTorr or less. Typically, the target-to-substrate distance is less than about 100 mm, or less than about 80 mm, or less than about 70 mm. Typically, the PD value is less than about 75 Pa*mm, or less than about 50 Pa*mm, or less than about 25 Pa*mm, The ion and neutral energy arriving at the substrate for the mild plasma conditions will generally be less than about 20 eV, or less than about 15 eV, or less than about 10 eV, or less than about 5 eV for either Ar or Kr. For the more energetic plasma conditions, the ion and neutral energy arriving at the substrate will generally be greater than about 50 eV, or greater than about 60 eV, or greater than about 70 eV, or greater than about 80 eV, or greater than about 90 eV for either Ar or Kr. These conditions are used for a substrate at low temperature, e.g., a substrate at a temperature of less than about 150° C.

An inorganic layer deposited by the methods and under the mild plasma conditions discussed above has very low density and a severely compromised barrier property. For the sake of convenience, we will refer to the inorganic layer as an "oxide" layer in the following discussion.

Some reasons for poor barrier performance are described below.

Figure 14:
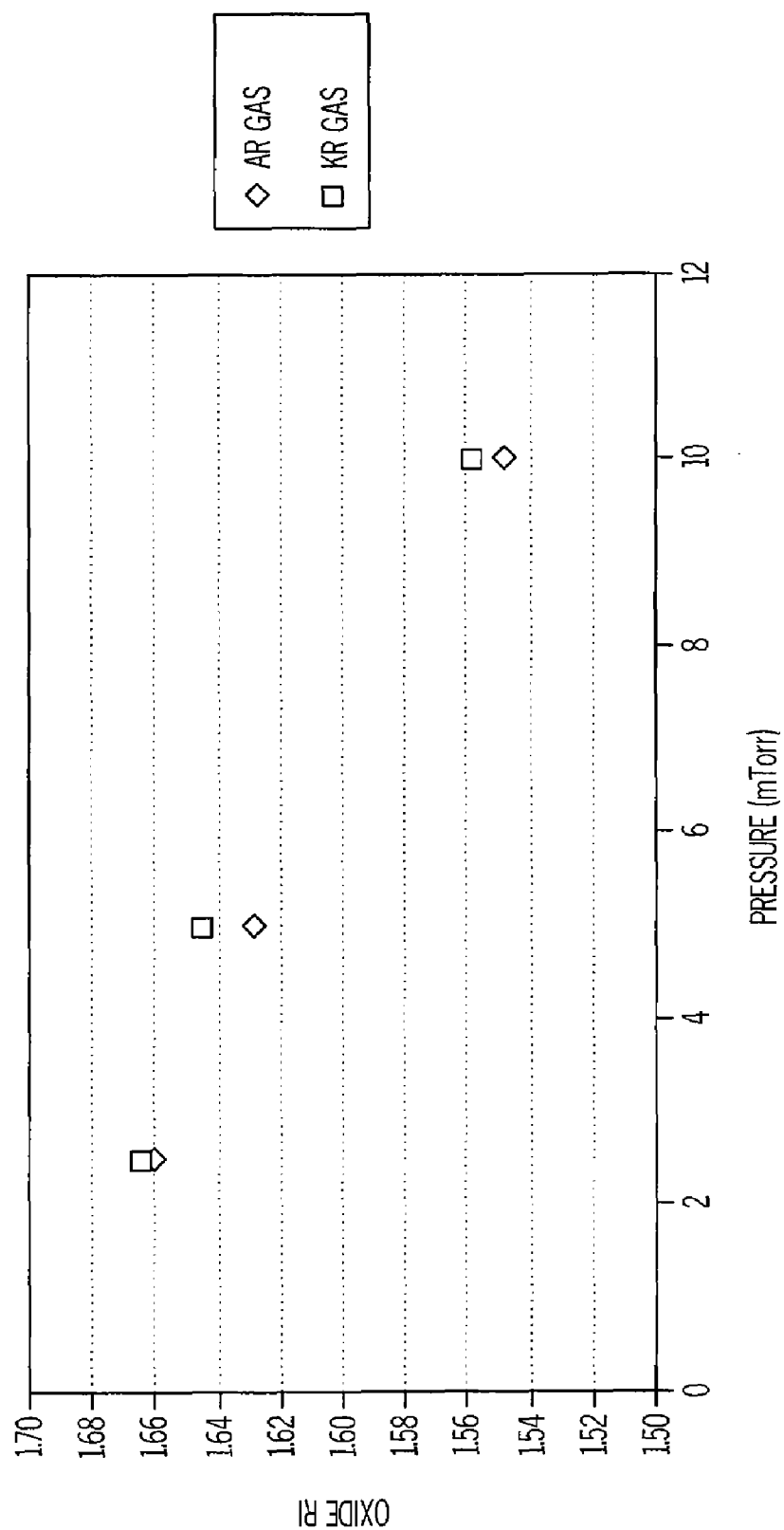
FIG. 14 is a graph showing the refractive index of the barrier layer as a function of the plasma gas pressure.
Figure 15A:
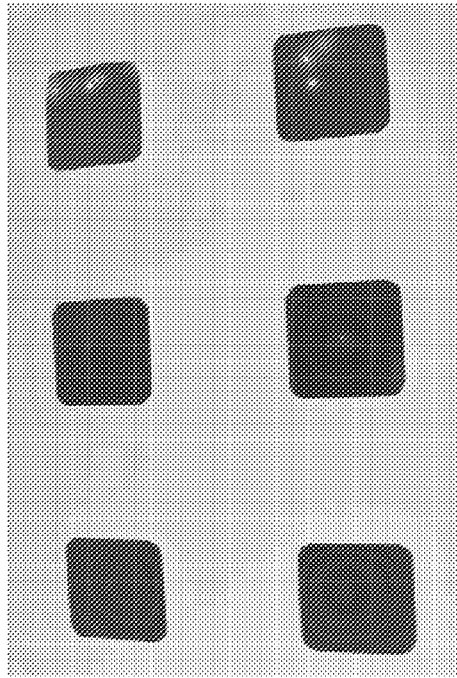
FIGS. 15A-15C are photographs showing the effect of plasma gas pressure on barrier performance.
Figure 15C:
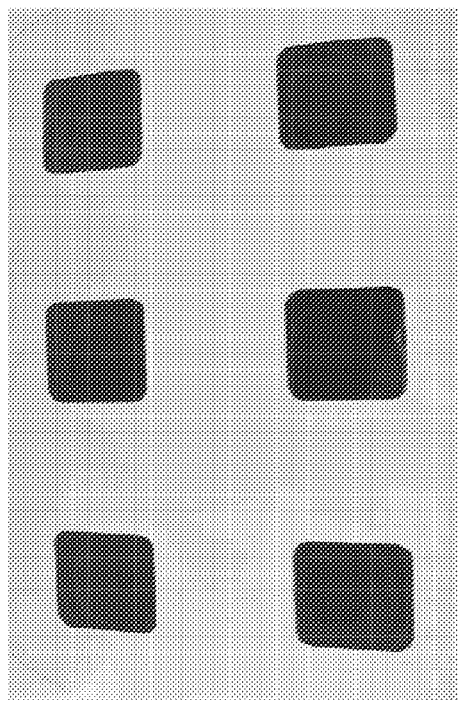
Figure 15B:
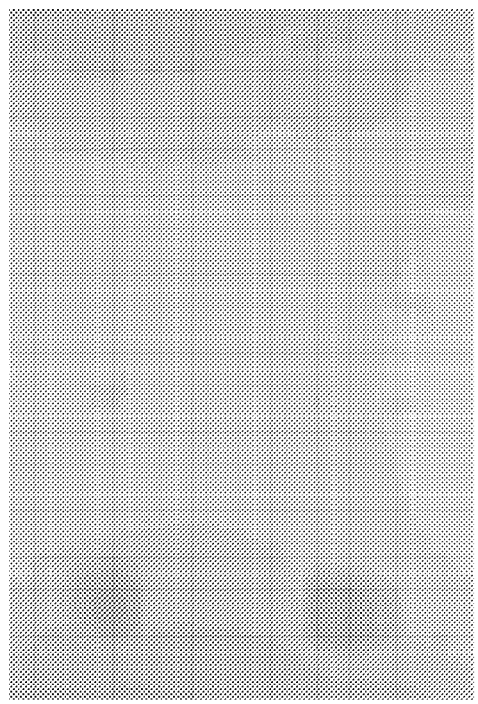

High P and D produce films with lower film density and high voids. Smith, et al, J. Appl. Phys. 79 (3), 1996 P. 1448, which is incorporated herein by reference. It is well known that a lower refractive index (RI) indicates that the film has a less dense microstructure. FIG. 14 shows the effect of changing the process pressure on the RI of the oxide. The degradation of barrier performance with increasing pressure is shown in FIG. 15 for Ca coupons encapsulated with a multilayer structure of 4 layers of aluminum oxide and 5 layers of acrylate polymer. The calcium test is described in Nisato G., Kuilder M., Piet Bouten, Moro L., Philips O., Rutherford N., "Thin film Encapsulation for Olds: Evaluation of multi-layer barriers using the Ca test", Society for Information Display, 2003 International Symposium, Digest of Technical Papers, Vol. XXXIV, P. 88, which is incorporated herein by reference. The hardware configuration used in the oxide deposition of these samples was the same, and the Ar pressure varied between 2.5 and 10 mTorr. The sample coated using 2.5 mTorr did not show any degradation upon aging for 500 h at 60° C./90% RH (FIG. 15A). Only a faint impression of the metallic calcium can be seen after 500 h, 60 C/90% RH aging of the sample coated using 5 mTorr (FIG. 15B). Finally, the sample coated using 10 mTorr showed degradation after a few hours at room temperature and humidity (40%) (FIG. 15C). This sequence of samples shows the degradation of barrier performance for oxides deposited with higher pressure.

The degradation of the oxide barrier performance is also shown in FIG. 16 for Olds encapsulated with 3 aluminum oxide/acrylate polymer layer pairs and aged for 500 h at 60° C./90% RH. When the oxide layer was deposited at 4.5 mTorr, the Olds were severely degraded by the growth of large black spots which were visible to the naked eye (i.e., about 80 µm or more) (FIG. 16B). In contrast, when the oxide layer was deposited at 3.5 mTorr and aged under the same conditions, the Olds did not show any degradation visually (FIG. 16A). More importantly, the average size of black spots measured on the sample deposited at 3.5 mTorr, 10 µm, is comparable to the size of black spots measured on samples deposited under conditions which are known to produce a good barrier layer, for example, at 2.5 mTorr and encapsulated with six aluminum oxide/acrylate layer pairs.

In order to achieve good barrier performance without damage to the polymer layer, a composite inorganic barrier layer is used. First, an inorganic non-barrier layer is deposited on the polymer layer with mild plasma conditions. By mild plasma conditions, we mean PD is greater than 100 Pa*mm, or the ion and neutral energy arriving at the substrate is less than about 20 eV, or both. The mild plasma conditions avoid damage to the polymeric layer, but result in an inorganic layer which lacks barrier properties (an inorganic non-barrier layer). A second inorganic layer is deposited with a more energetic plasma process in order to create a barrier layer. This is a preferred method because it does not require any extra processing equipment, and it can be implemented as a simple variation of the existing oxide deposition process.

The composite inorganic barrier layer can include one or more inorganic non-barrier layers deposited under the same conditions or varying conditions. For example, the first inorganic non-barrier layer can be deposited under the mildest conditions, and a second inorganic non-barrier layer can be deposited on the first under more stringent conditions, but still not forming a barrier layer. In addition, there can one or more barrier layers in the composite inorganic barrier layer.

Alternatively, there can be a single inorganic layer which is deposited under conditions which vary from mild plasma conditions to more energetic plasma conditions. For example, the plasma discharge pressure and/or the target-to-substrate distance could be decreased during the deposition process. Thus, the barrier properties of the inorganic layer will vary through its thickness, with the portion nearest the polymeric decoupling layer not having barrier properties, while another portion will exhibit barrier properties.

The inorganic layers in the barrier stacks may be any suitable barrier material. The non-barrier and barrier inorganic layers can be made of the same material or a different material. Suitable inorganic materials based on metals include, but are not limited to, individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, or combinations thereof. Metals include, but are not limited to, transition ("d" block) metals, lanthanide ("f" block) metals, aluminum, indium, germanium, tin, antimony and bismuth, and combinations thereof. Many of the resultant metal based materials will be conductors or semiconductors. The fluorides and oxides will include dielectrics (insulators), semiconductors and metallic conductors. Non-limiting examples of conductive oxides include aluminum doped zinc oxide, indium tin oxide (ITO), antimony tin oxide, titanium oxides (TiO$_x$ where $0.8 \leq x \leq 1$) and tungsten oxides (WO$_x$ where $2.7 \leq x < 3.0$). Suitable inorganic materials based on p block semiconductors and non-metals include, but are not limited to, silicon, silicon compounds, boron, boron compounds, carbon compounds including diamond-like carbon, and combinations of. Silicon compounds include, but are not limited to silicon oxides (SiO$_x$ where $1 \leq x \leq 2$), polysilicic acids, alkali and alkaline earth silicates, aluminosilicates (Al$_x$SiO$_y$), silicon nitrides (SN$_x$H$_y$ where $0 \leq y < 1$), silicon oxynitrides (SiN$_x$O$_y$H$_z$ where $0 \leq z < 1$), silicon carbides (SiC$_x$H$_y$ where $0 \leq y < 1$), and silicon aluminum oxynitrides (SIALONs). Boron compounds include, but are not limited to, boron carbides, boron nitrides, boron oxynitrides, boron carbonitrides, and combinations thereof with silicon.

Substantially opaque barrier layers can be made from opaque materials including, but not limited to, opaque metals, opaque polymers, and combinations thereof.

Preferred barrier materials include, but are not limited to, aluminum oxides (AlO$_x$ and AlO$_x$H$_y$ where $1.5 \leq x \leq 2$ and $0 \leq y \leq 1$), aluminosilicates (Al$_x$SiO$_y$), silicon oxynitrides (SiN$_x$O$_y$H$_z$ where $0 \leq z < 1$), silicon nitrides (SN$_x$H$_y$ where $0 \leq y < 1$), and silicon oxides (SiO$_x$ where $1 \leq x \leq 2$).

The thickness of the inorganic non-barrier layer may be limited to avoid defect propagation in the inorganic barrier layer. If the inorganic non-barrier layer deposited in mild plasma conditions is too thick, the high roughness and large defects on its surface prevent uniform nucleation of the inorganic barrier layer. An example of this is shown in FIG. 17, where a Ca coupon is encapsulated with a composite inorganic barrier layer. The inorganic non-barrier layer is deposited on the acrylate polymer using mild plasma conditions (10 mT, 2 kW), while the inorganic barrier layer is deposited using more energetic plasma conditions (2.5 mTorr, 2 kW). The thickness of the inorganic non-barrier layer was varied from 100 to 400 Å, while the thickness of the inorganic barrier layer remained constant. FIG. 17 shows accelerated test results obtained upon aging the Ca coupons at 60° C./90% RH for 500 h. The barrier performance of the composite inorganic barrier layer was degraded as the thickness of the inorganic non-barrier layer was increased from 100 Å (FIG. 17A) to 200 Å (FIG. 17B) to 400 Å (FIG. 17C). The problem related to the thickness of the inorganic non-barrier layer also occurs with protective layers deposited by evaporation.

Figure 18:
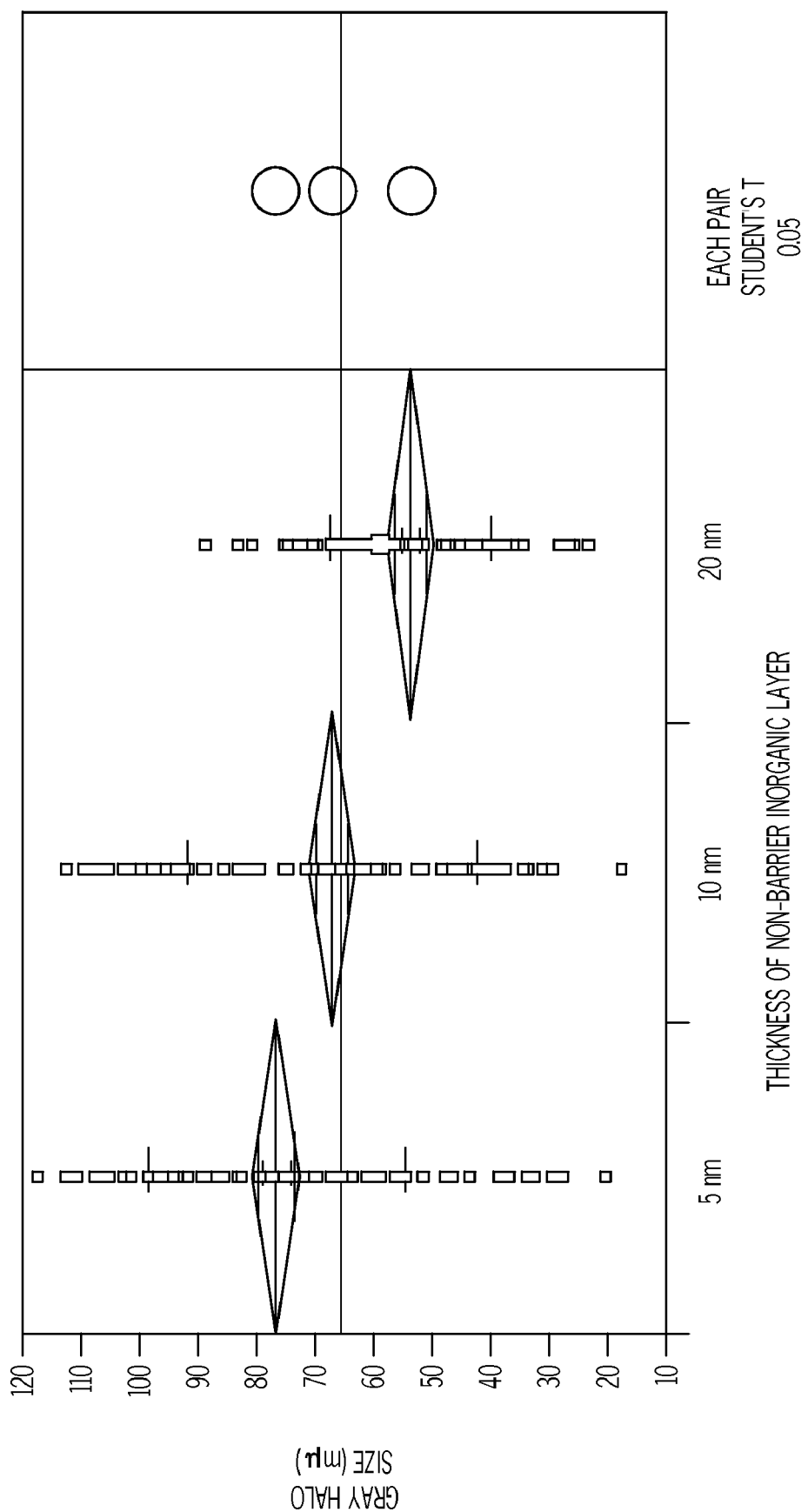
FIG. 18 is a graph showing the effect of the thickness of the inorganic non-barrier layer on the size of the halo.

The following discussion relates to inorganic non-barrier layers deposited using plasma processes. The thickness of the inorganic non-barrier layer is a compromise among several factors: 1) The thickness should be low to avoid the propagation of defects to the inorganic barrier layer. If the adjacent barrier layer is more energetic, higher thickness is allowed. 2) The thickness should be high enough to provide effective protection. A comparison of black spot and gray halo size is shown in FIG. 18 for Olds encapsulated with a structure: OLED/inorganic non-barrier aluminum oxide layer (thickness=5, 10, 20 nm)/inorganic barrier aluminum oxide layer (thickness=30 nm)/can+desiccant). The inorganic non-barrier layer was deposited at a pressure of 4.5 mTorr, and the inorganic barrier layer was deposited at 2.5 mTorr. FIG. 18 shows how the size of the gray halo decreased with increasing thickness of the inorganic non-barrier layer. As a reference, the typical average size of the gray halo for samples with no inorganic non-barrier layer is larger than 60 µm. In principle, more energetic barrier layer deposition requires a thicker inorganic non-barrier layer. This is illustrated in FIG. 19, where two sets of samples were tested for polymer plasma damage using the UV ozone test. In both samples, the inorganic non-barrier layer was deposited in mild conditions (10 mTorr, 2.0 in., 2 kW, PD=78) and with increasing thickness. For one set, the barrier oxide layer was deposited using 2 kW (FIGS. 19a, 19b, and 19c), while for the other, it was deposited using 4 kW (FIGS. 19d and 19e). The thickness of the barrier oxide layer was kept constant at 400 Å. In FIG. 19a, there was no inorganic non-barrier layer, and the inorganic barrier layer was 400 Å. In FIG. 19b, the inorganic non-barrier layer was 100 Å, and the inorganic barrier layer was 400 Å. In FIG. 19c, the inorganic non-barrier layer was 200 Å, and the inorganic barrier layer was 400 Å. In FIG. 19d, the inorganic non-barrier layer was 100 Å, and the inorganic barrier layer was 400 Å. In FIG. 19e, the inorganic non-barrier layer was 300 Å, and the inorganic barrier layer was 400 Å. FIG. 19 shows that a non-barrier oxide layer 100 Å thick was sufficient to protect the polymer layer if the barrier oxide layer was deposited at 2 kW (FIG. 19b), but not when the barrier oxide layer was deposited at 4 kW (FIG. 19d). FIG. 19e shows that a non-barrier oxide layer 300 Å thick was sufficient to prevent the damage for the 4 kW barrier oxide layer. 3) The thickness should be the minimum needed, in order to increase the overall process throughput.

The composite inorganic barrier layer can also be used with polymeric substrates which may be sensitive to exposure to plasma. Examples of such substrates include, but are not limited to, PET and PEN. These substrates are rich in C—O—C bonds, which can be damaged by the plasma. A composite inorganic barrier layer could be deposited on the substrate before a barrier stack.

The composite inorganic barrier layer of the present invention can be used in multilayer barrier stacks in a variety of applications. For example, they can be used to encapsulate environmentally sensitive devices, as shown in FIGS. 20-24. Environmentally sensitive devices include, but are not limited to, organic light emitting devices, liquid crystal displays (LCDs), light emitting diodes (LEDs), light emitting polymers (LEPs), electrophoretic inks, electroluminescent devices (EDs), phosphorescent devices, and microelectronic devices, including integrated circuits, charge coupled devices, light emitting diodes, light emitting polymers, organic light emitting devices, metal sensor pads, micro-disk lasers, electrochromic devices, photochromic devices, microelectromechanical systems, and solar cells.

Figure 20:
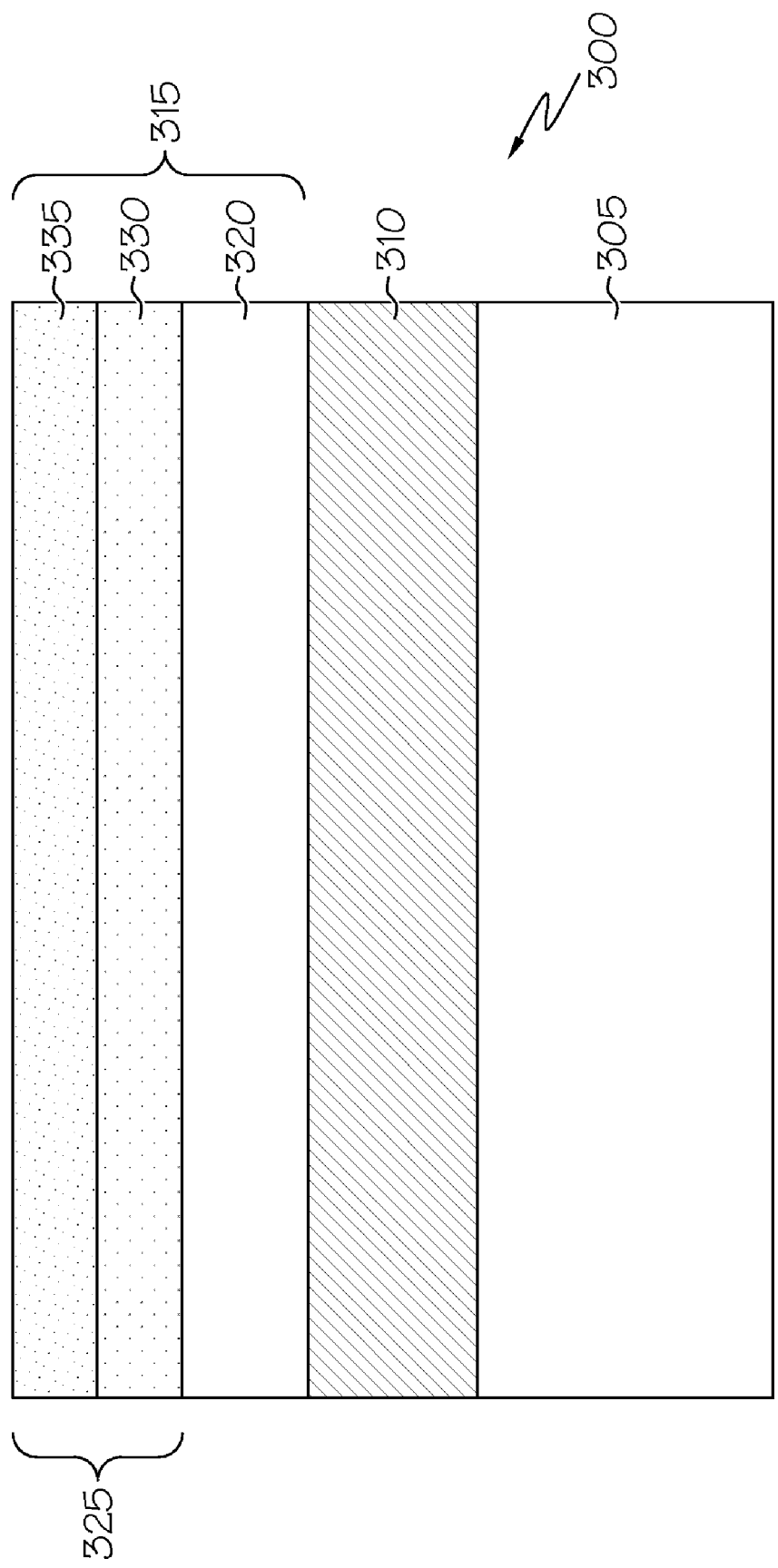
FIG. 20 is a cross-section of one embodiment of an environmentally sensitive device encapsulated using a barrier stack containing a composite barrier layer.

In FIG. 20, the encapsulated environmentally sensitive device 300 includes a substrate 305. The environmentally sensitive device 310 is adjacent to the substrate 305. The barrier stack 315 includes a polymeric decoupling layer 320 and the composite inorganic barrier layer 325. The composite inorganic barrier layer 325 includes an inorganic non-barrier layer 330 on the polymeric decoupling layer 320 and an inorganic barrier layer 335 on the inorganic non-barrier layer 330.

Figure 21:
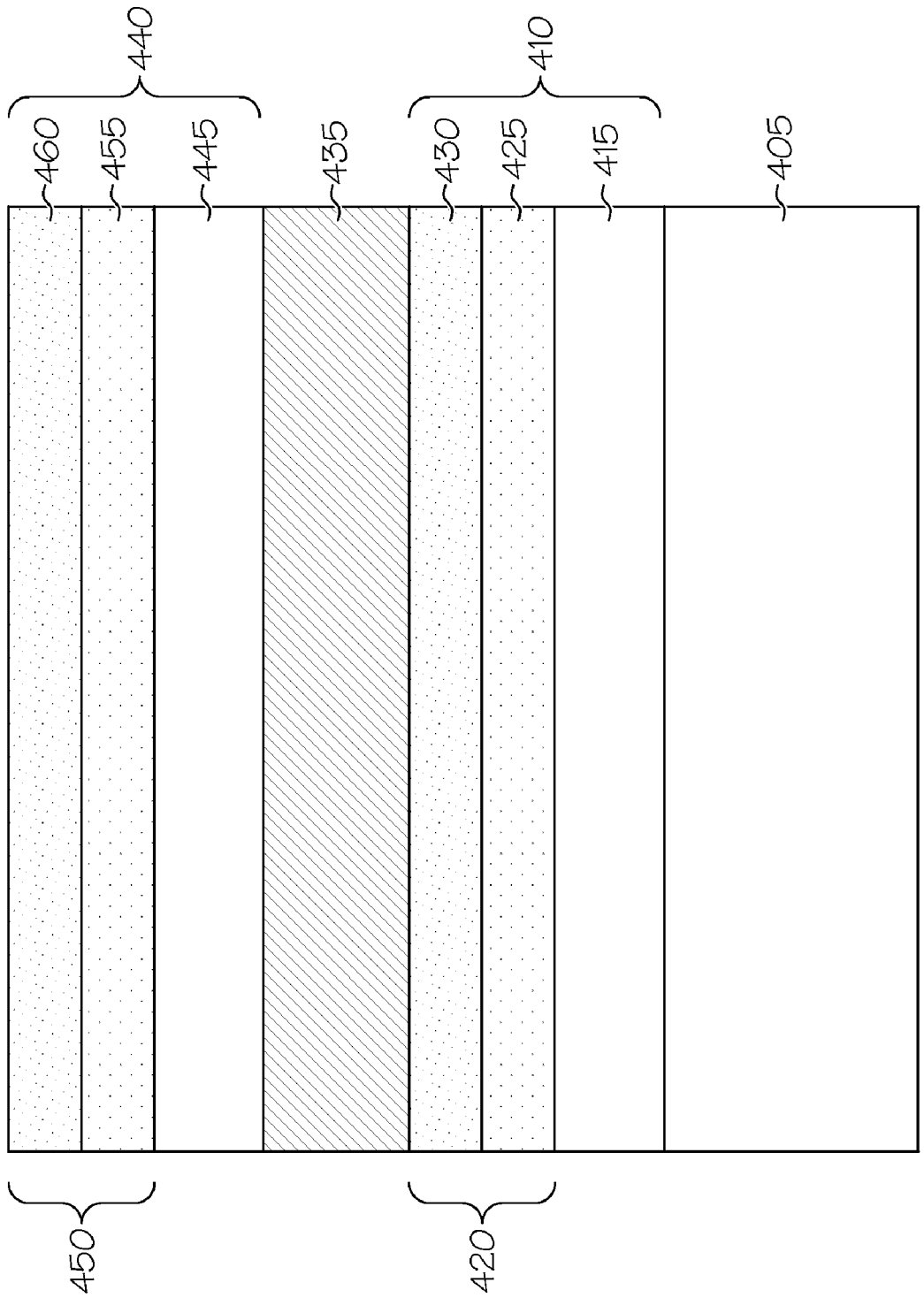
FIG. 21 is a cross-section of another embodiment of an environmentally sensitive device encapsulated using a barrier stack containing a composite barrier layer.

Another embodiment of an encapsulated environmentally sensitive device is shown in FIG. 21. In this arrangement, barrier stacks 410 and 440 encapsulate the environmentally sensitive device 435. The barrier stack 410 is adjacent to substrate 405. The barrier stack 410 includes polymeric decoupling layer 415, and composite inorganic barrier layer 420. Composite inorganic barrier layer 420 includes inorganic non-barrier layer 425 on the polymeric decoupling layer and inorganic barrier layer 430 on the inorganic non-barrier layer 425. The environmentally sensitive device 435 is adjacent to the inorganic barrier layer 430. A second barrier stack 440 is adjacent to the environmentally sensitive device 435. The second barrier stack 440 includes a polymeric decoupling layer 445 and a composite barrier layer 450. The composite barrier layer 450 includes an inorganic non-barrier layer 455 and an inorganic barrier layer 460.

Figure 22:
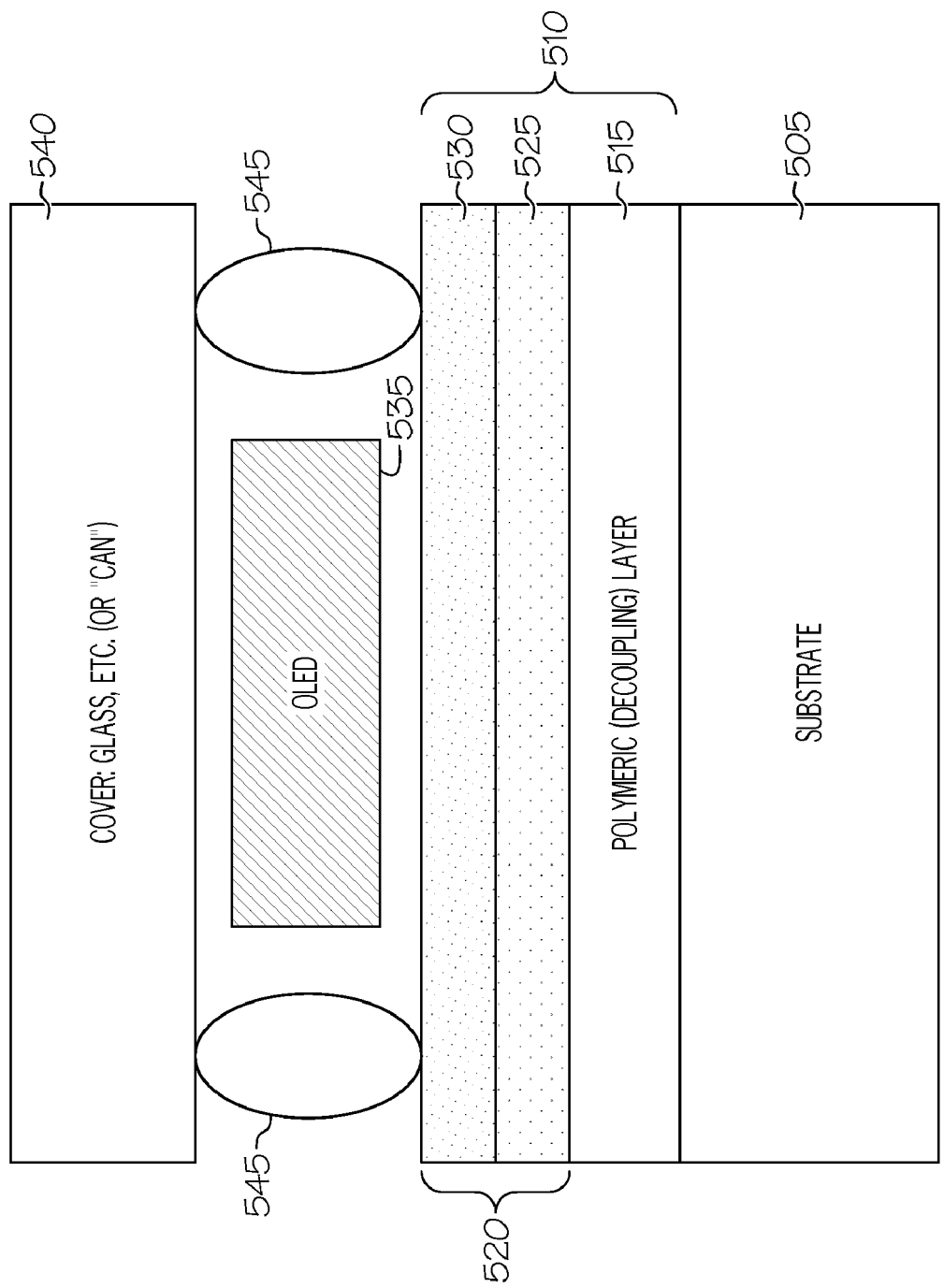
FIG. 22 is a cross-section of another embodiment of an environmentally sensitive device encapsulated using a barrier stack containing a composite barrier layer.

An alternate embodiment of an encapsulated environmentally sensitive device is illustrated in FIG. 22. The substrate 505 has a barrier stack 510. The barrier stack 510 includes polymeric decoupling layer 515 and composite inorganic barrier layer 520, comprising inorganic non-barrier layer 525 and inorganic barrier layer 530. The environmentally sensitive device 535 is encapsulated using a cover 540, which can be a glass cover, a metal can, etc. The cover 540 is sealed to the inorganic barrier layer 530 using an adhesive or seal 545.

Figure 23:
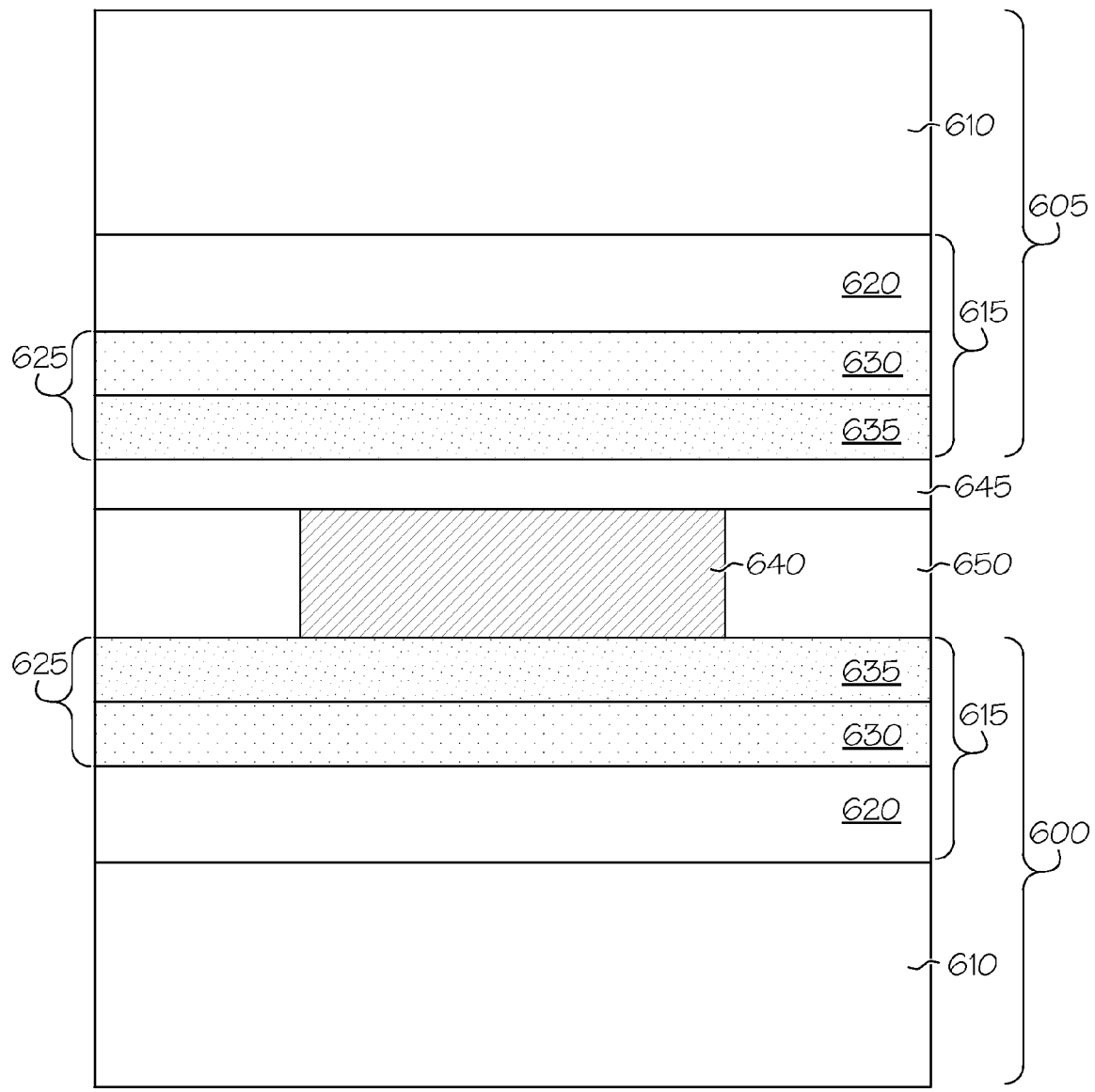
FIG. 23 is a cross-section of another embodiment of an environmentally sensitive device encapsulated using a barrier stack containing a composite barrier layer.

Still another embodiment is shown in FIG. 23. In this embodiment, the environmentally sensitive device is encapsulated between two sheets 600 and 605. The sheets 600 and 605 include a substrate 610 and a barrier stack 615. The barrier stack includes a polymeric decoupling layer 620 and a composite barrier layer 625, comprising an inorganic non-barrier layer 630 and an inorganic barrier layer 635. The environmentally sensitive device 640 is placed on the first sheet 600. The second sheet 605 is adhered to the first sheet 600 using an adhesion layer 645 and a passivation layer 650. Suitable passivation layers 650 include, but are not limited to, silicon oxide, and silicon nitride.

Figure 24:
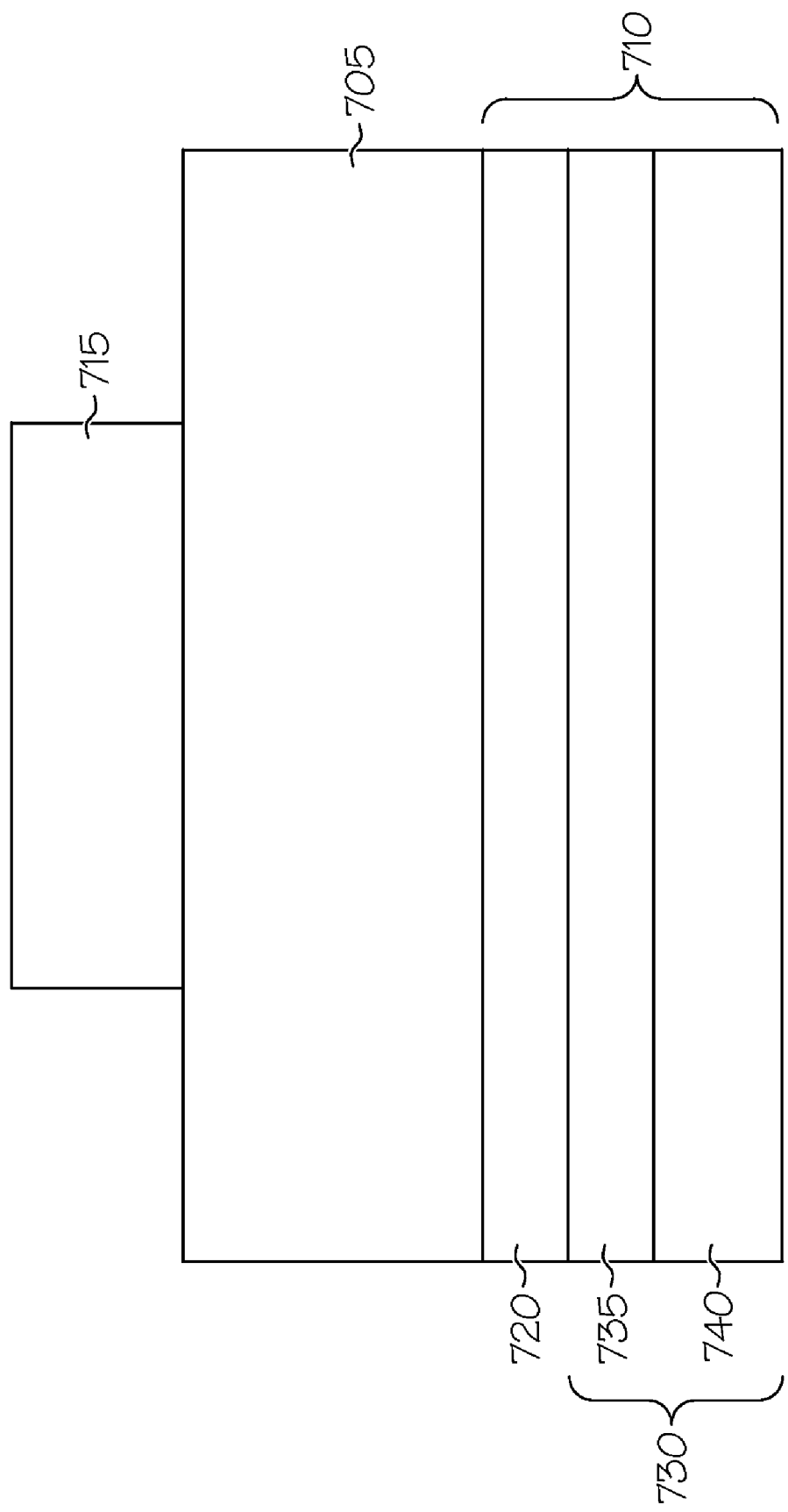
FIG. 24 is a cross-section of an embodiment of an environmentally sensitive device with a barrier stack containing a composite barrier layer on the opposite side of the substrate.

In FIG. 24, substrate 705 has a barrier stack 710 on one side and an environmentally sensitive device 715 on the other side. The barrier stack 710 includes a polymeric decoupling layer 720 and a composite barrier layer 730. The composite barrier layer 730 includes inorganic non-barrier layer 735 and inorganic barrier layer 740. The environmentally sensitive device would need to be encapsulated by a barrier, such as a barrier stack containing a composite barrier layer, a barrier stack, a metal can, an epoxy seal, and the like.

Figure 25:
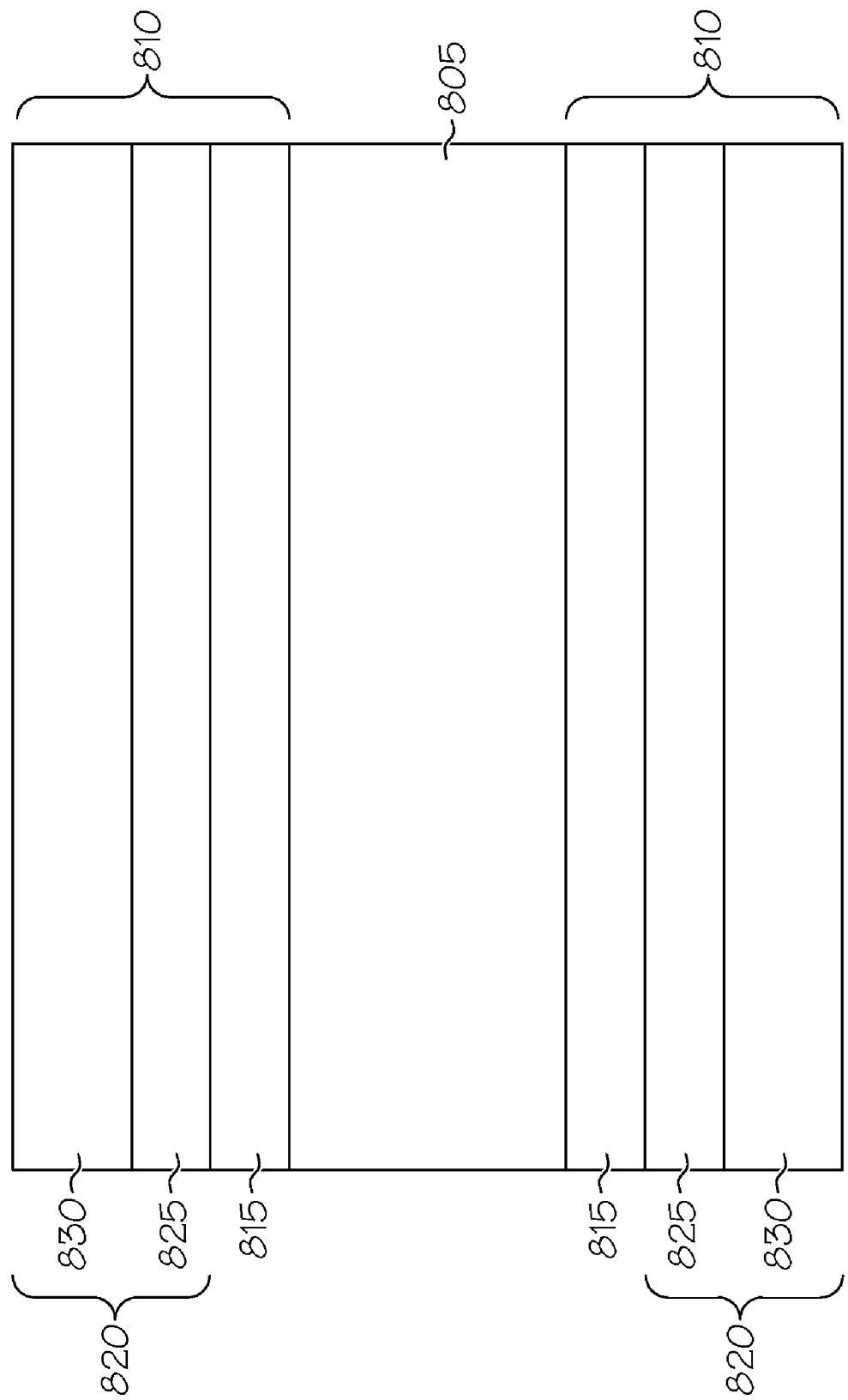
FIG. 25 is a cross-section of an embodiment of a substrate having barrier stacks containing composite barrier layers on both sides.

FIG. 25 shows a substrate 805 with barrier stacks 810 on both sides. The barrier stacks 810 include polymeric decoupling layers 815 and composite barrier layers 820. Composite barrier layers 820 include inorganic non-barrier layers 825 and inorganic barrier layers 830. Alternatively, there could be a barrier stack of the present invention on one side, and another type of barrier stack on the other side, if desired.

These examples of uses for the barrier stacks of the present invention are intended to be illustrative and are not intended to be limiting. Those of skill in the art will recognize that the barrier stacks can be used in a wide variety of applications.

The barrier stack incorporating the composite inorganic barrier layer can be edge sealed. Suitable edge sealing methods include, but are not limited to, those described in U.S. Pat. No. 6,866,901, U.S. application Ser. No. 11/068,356, filed Feb. 28, 2005, U.S. application Ser. No. 11/627,583, filed Jan. 26, 2007, U.S. application Ser. No. 11/693,020, filed Mar. 29, 2007, and U.S. application Ser. No. 11/693,022, filed Mar. 29, 2007, all of which are incorporated by reference herein.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A barrier stack made by the process of:
   depositing a polymeric decoupling layer on a substrate;
   depositing a first inorganic layer on the polymeric decoupling layer under a first set of conditions wherein an ion and neutral energy arriving at the substrate is less than about 20 eV so that the first inorganic layer is not a barrier layer, wherein a temperature of the substrate is less than about 150° C.; and
   depositing a second inorganic layer on the first inorganic layer under a second set of conditions wherein an ion and neutral energy arriving at the substrate is greater than about 50 eV so that the second inorganic layer is a barrier layer.

2. The barrier stack of claim 1 wherein the polymeric decoupling layer is selected from acrylates, thiols, epoxies, polyesters, siloxanes, urethanes, or combinations thereof.

3. The barrier stack of claim 1 wherein the inorganic non-barrier layer or the inorganic barrier layer or both is selected from metals, metal oxides, metal fluorides, metal nitrides, metal carbides, metal carbonitrides, metal oxynitrides, metal borides, metal oxyborides, metal silicides, or combinations thereof.

4. The barrier stack of claim 1 wherein the inorganic non-barrier layer or the inorganic barrier layer or both is selected from aluminum oxides, aluminosilicates, silicon oxynitrides, silicon nitrides, silicon oxides, or combinations thereof.

5. The barrier stack of claim 1 wherein the inorganic non-barrier layer and the inorganic barrier layer are made of different materials.

6. The barrier stack of claim 1 wherein the substrate includes an environmentally sensitive device thereon.

7. The barrier stack of claim 1 further comprising a composite inorganic barrier layer between the substrate and the barrier stack, the composite inorganic barrier layer comprising an inorganic non-barrier layer on the substrate and an inorganic barrier layer on the inorganic non-barrier layer.

8. The barrier stack of claim 1 wherein the barrier stack has an edge seal.

9. A barrier stack made by the process of:
   depositing a polymeric decoupling layer on a substrate;
   depositing an inorganic layer on the polymeric decoupling layer at first set of conditions wherein an ion and neutral energy arriving at the substrate is less than about 20 eV so that a first portion of the inorganic layer adjacent to the polymeric decoupling layer is not a barrier layer, wherein a temperature of the substrate is less than about 150° C., and changing to a second set of conditions wherein an ion and neutral energy arriving at the substrate is greater than about 50 eV so that a second portion of the inorganic layer is a barrier layer.

10. The barrier stack of claim 9 wherein the polymeric decoupling layer is selected from acrylates, thiols, epoxies, polyesters, siloxanes, urethanes, or combinations thereof.

11. The barrier stack of claim 9 wherein the inorganic non-barrier layer or the inorganic barrier layer or both is selected from metals, metal oxides, metal fluorides, metal nitrides, metal carbides, metal carbonitrides, metal oxynitrides, metal borides, metal oxyborides, metal silicides, or combinations thereof 12. The barrier stack of claim 9 wherein the substrate includes an environmentally sensitive device thereon.

13. The barrier stack of claim 9 further comprising a composite inorganic barrier layer between the substrate and the barrier stack, the composite inorganic barrier layer comprising an inorganic non-barrier portion on the substrate and a inorganic barrier portion on the inorganic non-barrier portion.

14. The barrier stack of claim 9 wherein the barrier stack has an edge seal.

15. A method of reducing damage to a polymeric decoupling layer in a barrier stack comprising:
depositing the polymeric decoupling layer on a substrate;
depositing a first inorganic layer on the polymeric decoupling layer under a first set of conditions wherein an ion and neutral energy arriving at the substrate is less than about 20 eV so that the first inorganic layer is not a barrier layer, wherein a temperature of the substrate is less than about 150° C.; and
depositing a second inorganic layer on the first inorganic layer under a second set of conditions wherein an ion and neutral energy arriving at the substrate is greater than about 50 eV so that the second inorganic layer is a barrier layer.

16. The method of claim 15 wherein the first inorganic layer is deposited using a process selected from sputtering, reactive sputtering, chemical vapor deposition, plasma enhanced chemical vapor deposition, evaporation, sublimation, electron cyclotron resonance-plasma enhanced chemical vapor deposition, physical vapor deposition, atomic layer deposition, or combinations thereof.

17. The method of claim 15 wherein the second inorganic layer is deposited using a process selected from sputtering, reactive sputtering, hot wire chemical vapor deposition, plasma enhanced chemical vapor deposition, evaporation, sublimation, electron cyclotron resonance-plasma enhanced chemical vapor deposition, physical vapor deposition, ion assisted physical vapor deposition, atomic layer deposition, or combinations thereof.

18. The method of claim 15 wherein the first inorganic layer is deposited so that the ion and neutral energy arriving at the substrate is less than about 15 eV.

19. The method of claim 15 wherein the first inorganic layer is deposited so that a product of a plasma gas discharge pressure and a target-to-substrate distance is greater than about 80 Pa*mm.

20. The method of claim 15 wherein the first inorganic layer is deposited by sputtering.

21. The method of claim 15 wherein the second inorganic layer is deposited so that the ion and neutral energy arriving at the substrate is greater than about 70 eV.

22. The method of claim 15 wherein the second inorganic layer is deposited so that a product of a plasma gas discharge pressure and a target-to-substrate distance is less than about 80 Pa*mm.

23. The method of claim 15 wherein the second layer is deposited by sputtering.

24. The method of claim 15 wherein the first and second inorganic layers are made of different materials.

25. The method of claim 15 wherein the substrate includes an environmentally sensitive device thereon.

26. A method of reducing damage to a polymeric decoupling layer in a barrier stack comprising:
depositing the polymeric decoupling layer on a substrate;
depositing an inorganic layer on the decoupling layer at first set of conditions wherein an ion and neutral energy arriving at the substrate is less than about 20 eV so that a first portion of the inorganic layer adjacent to the polymeric decoupling layer is not a barrier layer, wherein a temperature of the substrate is less than about 150° C., and changing to a second set of conditions wherein an ion and neutral energy arriving at the substrate is greater than about 50 eV so that a second portion of the inorganic layer is a barrier layer.

27. The method of claim 26 wherein the inorganic layer is sputter deposited, and wherein at the first set of conditions a product of a plasma gas discharge pressure and a target-to-substrate distance is greater than about 100 Pa*mm and wherein at the second set of conditions a product of a plasma gas discharge pressure and a target-to-substrate distance is less than about 75 Pa*mm.

28. The method of claim 26 wherein the substrate includes an environmentally sensitive device thereon.

29. A method of reducing damage to a polymeric decoupling layer in a barrier stack comprising:
depositing the polymeric decoupling layer on a substrate;
placing a screen between a target and the substrate;
plasma depositing a first inorganic layer on the polymeric decoupling layer under conditions so that the first inorganic layer is not a barrier layer; and
plasma depositing a second inorganic layer on the first inorganic layer so that the second inorganic layer is a barrier layer.

* * * * *